United States Patent
Nagase et al.

(10) Patent No.: US 7,190,613 B2
(45) Date of Patent: Mar. 13, 2007

(54) MAGNETIC RANDOM ACCESS MEMORY DEVICE HAVING THERMAL AGITATION PROPERTY AND HIGH WRITE EFFICIENCY

(75) Inventors: Toshihiko Nagase, Kawasaki (JP); Hiroaki Yoda, Kawasaki (JP); Masatoshi Yoshikawa, Yokohama (JP); Tadashi Kai, Kawasaki (JP); Tatsuya Kishi, Yokohama (JP); Hisanori Aikawa, Yokohama (JP); Tomomasa Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 10/862,617

(22) Filed: Jun. 8, 2004

(65) Prior Publication Data

US 2005/0018478 A1    Jan. 27, 2005

(30) Foreign Application Priority Data

Jun. 23, 2003    (JP)    ............. 2003-178417

(51) Int. Cl.
*G11C 11/14*    (2006.01)

(52) U.S. Cl. ...................... 365/171; 365/158
(58) Field of Classification Search ................ 365/171
See application file for complete search history.

(56) References Cited

U.S. PATENT DOCUMENTS

| 6,101,072 A * | 8/2000 | Hayashi ............... 360/324 |
| 6,219,275 B1 * | 4/2001 | Nishimura ............ 365/173 |
| 6,538,921 B2 * | 3/2003 | Daughton et al. ..... 365/171 |
| 6,717,845 B2 | 4/2004 | Saito et al. |
| 2005/0018478 A1 | 1/2005 | Nagase et al. |
| 2005/0047262 A1 | 3/2005 | Ikeda |
| 2005/0281079 A1 | 12/2005 | Yoda et al. |

FOREIGN PATENT DOCUMENTS

JP    11-213650    8/1999

(Continued)

OTHER PUBLICATIONS

Naoki Nishimura, et al. "Magnetic Tunnel Junction Device with Perpendicular Magnetization Films for High-Density Magnetic Random Access Memory"; Journal of Applied Physics; vol. 91; No. 8; Apr. 15, 2002; pp. 5246-5249.

(Continued)

*Primary Examiner*—Thong Q. Le
(74) *Attorney, Agent, or Firm*—Oblon, Spivak, McClelland, Maier & Neustadt, P.C.

(57) ABSTRACT

An MTJ element has two magnetic layers and a nonmagnetic layer. The resistance of the MTJ element, which varies depending on whether the two magnetic layers are magnetized parallel or antiparallel. In an MRAM adapted to write data into the MTJ element by causing a write wiring to generate induced magnetic flux and consequently changing the direction of magnetization of the recording layer, the MTJ element is a perpendicular MTJ element in which each of the two magnetic layers is magnetized in a direction perpendicular to its plane. The write wiring is placed in a direction perpendicular to the direction of the thickness of the MTJ element and applies a generated magnetic field to the magnetic layers of the MTJ element in the direction in which they are magnetized. Magnetic yokes hold the MTJ element in the direction of its thickness.

24 Claims, 11 Drawing Sheets

FOREIGN PATENT DOCUMENTS

| | | |
|---|---|---|
| JP | 2002-100182 | 4/2002 |
| JP | 2003-31773 | 1/2003 |

OTHER PUBLICATIONS

R. Scheuerlein, et al., ISSCC2000 Technical Digest, vol. 43, Paper TA 7.2, pp. 128-129, "A 10NS Read and Write Non-Volatile Memory Array Using a Magnetic Tunnel Junction and Fet Switch in Each Cell", Feb. 7, 8, and 9, 2000.

T. Ikeda, et al., Journal of Japan Applied Magnetization, vol. 24, No. 4-2, pp. 563-566, "GMR and TMR Films Using GdFe Alloy With Perpendicular Magnetization"2000.

S. S. P. Parkin, Systematic Variation of Strength and Oscillation Period of Indirect Magnetic Exchange Coupling through the 3d, 4d, and 5d Transistion Metals, Physical Review Letters, Dec. 16, 1991, vol. 67, No. 25, pp. 3598-3601.

* cited by examiner

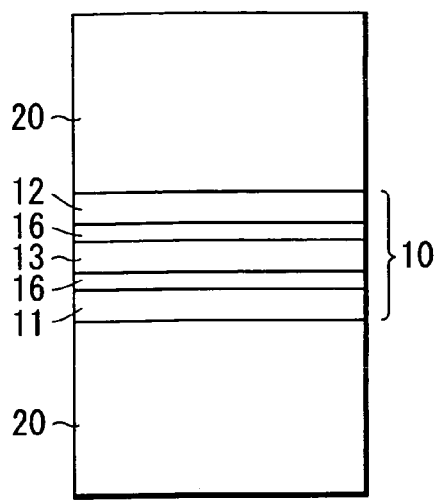 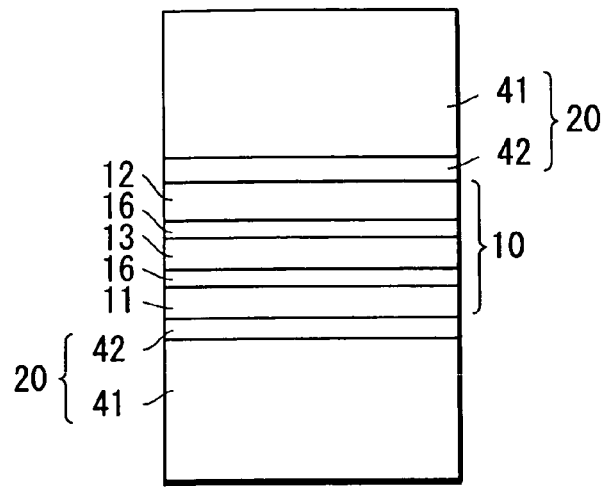
FIG. 10  FIG. 11
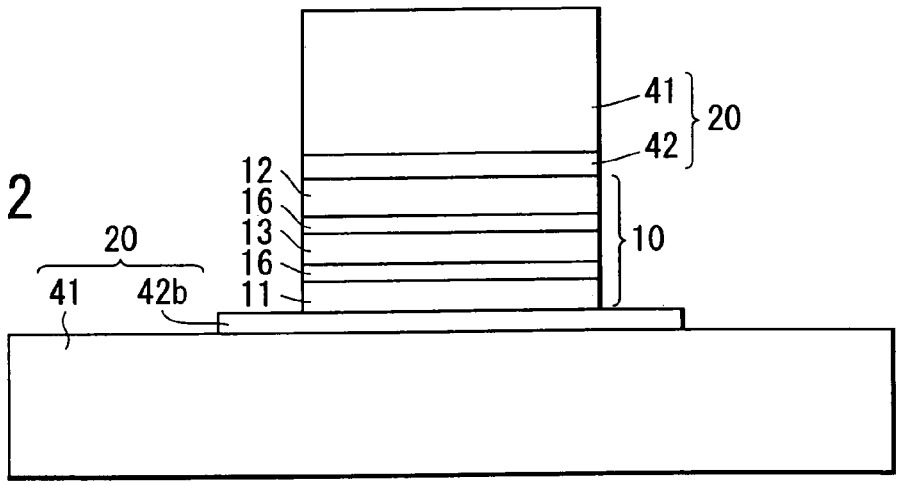
FIG. 12
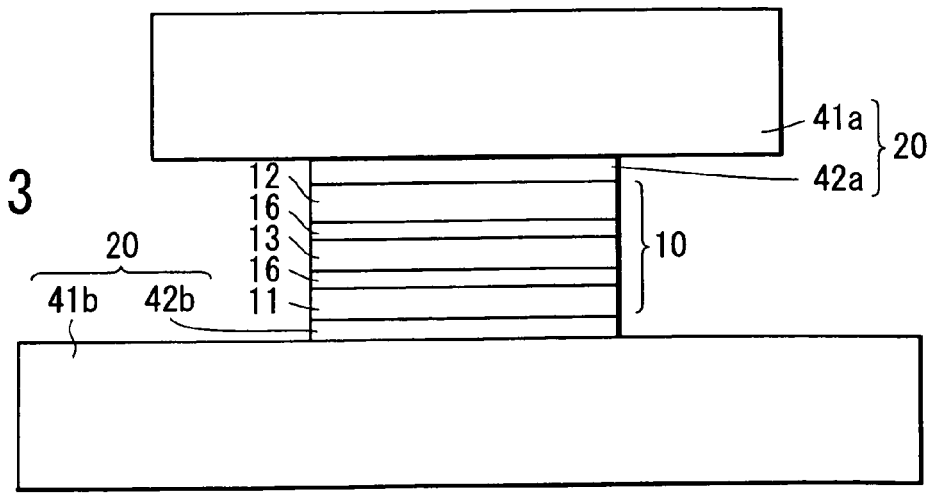
FIG. 13

TO FIRST MRAM-DATA REWRITE CONTROLLER

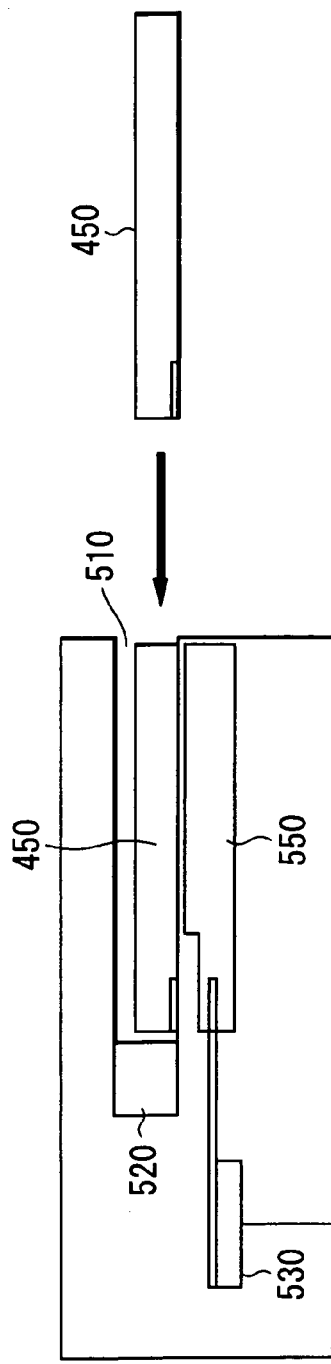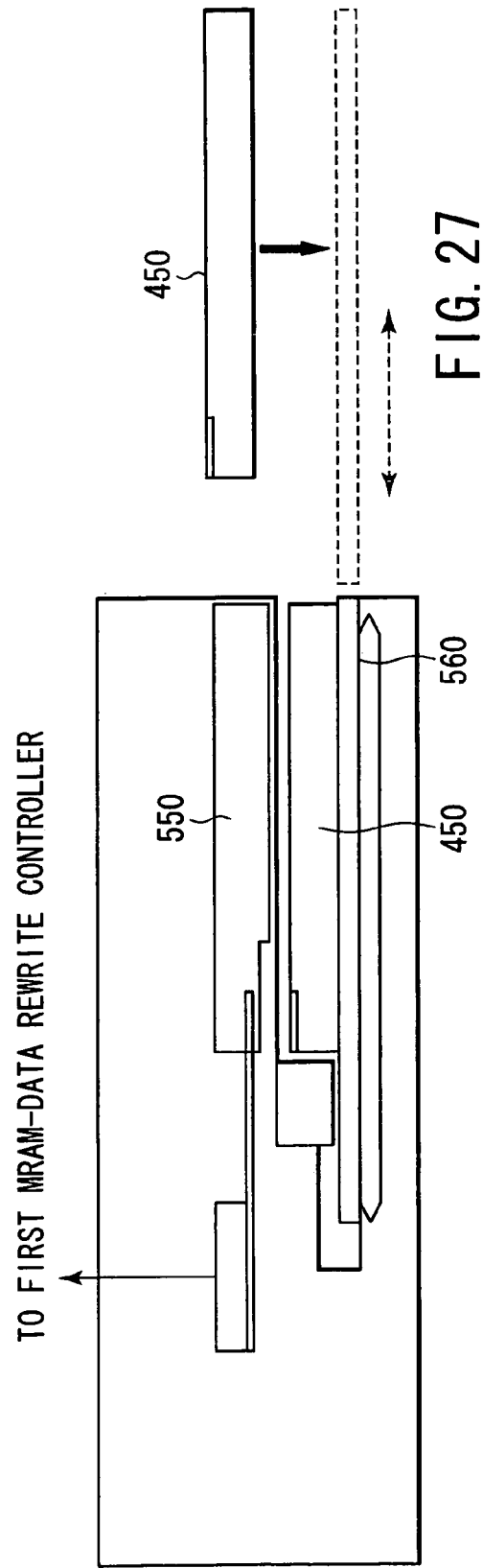

MAGNETIC RANDOM ACCESS MEMORY DEVICE HAVING THERMAL AGITATION PROPERTY AND HIGH WRITE EFFICIENCY

CROSS-REFERENCE TO RELATED APPLICATIONS

This application is based upon and claims the benefit of priority from prior Japanese Patent Application No. 2003-178417, filed Jun. 23, 2003, the entire contents of which are incorporated herein by reference.

BACKGROUND OF THE INVENTION

1. Field of the Invention

The present invention relates to a magnetic random access memory (MRAM) device and an electronic card and an electronic device using such a memory device and more specifically to the structure of a memory cell comprised of a storage element that stores a "1" or "0" of data using a tunneling magnetoresistive effect.

2. Description of the Related Art

In recent years, there have been proposed many memory devices which store information based on a new principle. As one of such memory device, an MRAM device having both the non-volatility and the rapidity in which a plurality of memory cells including magnetic tunnel junction elements (which will be referred to as MTJ elements hereinafter) having a tunneling magnetoresistive effect are arranged in a matrix form is disclosed in, e.g., Roy Scheuerlein et. al. "A 10 ns Read and Write Non-Volatile Memory Array Using a Magnetic Tunnel Junction and FET Switch in each Cell", ISSCC2000 Technical Digest pp. 128 to pp. 129.

The MTJ element has two magnetic layers which are generally referred to as a recording layer and a fixed layer. When programming data in the MTJ element, a current is caused to flow through a write wiring, and a magnetic field in a predetermined direction is applied to the MTJ element, thereby switching the direction of magnetization of the recording layer.

Meanwhile, the most serious problem in the MRAM device is a reduction in a write current. The present inventors found that overcoming a thermal agitation problem as a result of an experiment of holding the reliability of the MTJ element. This prehistory will now be described hereinafter.

Under the present situation, a write current value of the MTJ element is as large as 8 to 10 mA. For a practical application, the write current value must be lowered to an allowable level. In the case of a test chip of the MRAM device on a 1 K-bit level manufactured by the present inventors by way of trial, the write current value is 8 to 10 mA as was expected.

Further, bit information retention characteristics of the MTJ element were examined. As a result, irrespective of a fact that criteria $Ku \times V/kB \times T$ of the thermal agitation property which are usually considered in a magnetic medium of a hard disk storage apparatus are set to be not less than 80, some bits were switched. Here, V is a cubic volume of a recording layer of the MTJ element, kB is the Boltzmann constant, and T is an absolute temperature. In case of the MRAM device, Ku is given mainly based on a shape magnetic anisotropy as a general rule, and it is actually a sum of an anisotropic energy and an induced magnetic anisotropy.

For improving the thermal agitation property in order to prevent the bit information from being switched, $Ku \times V$ is usually set large. By doing so, however, the write current is increased.

In the MRAM device, it is desirable to achieve both a reduction in the write current and overcoming the thermal agitation property as described above. In the prior art, however, a concrete design plan for this purpose is not proposed. The prehistory that this problem was found will now be described in detail hereinafter.

At present, a reported write current value of the MTJ element is at least approximately 8 mA if a width of the MTJ element is approximately 0.6 μm and a length of the MTJ element is approximately 1.2 μm.

Usually, a shape of the MTJ element is determined as a rectangular or an ellipse, the shape magnetic anisotropy is given to the MTJ element, a direction of magnetization of the MTJ element is stipulated, and the thermal agitation property is also improved.

$Ku \times V$ is a product of a sum of the shape magnetic anisotropy and the induced magnetic anisotropy of the MTJ element, and a volume of the recording layer of the MTJ element. Here, the induced magnetic anisotropy of the recording layer is given in the same direction as that of the anisotropy based on a shape so as not to generate the dispersion of the anisotropy or the like. However, usually, NiFe used as a material of the recording layer has the induced magnetic anisotropy (several Oe) smaller than the anisotropic magnetic field (several ten Oe) based on a shape by a single digit, and it is considered that the thermal agitation property and the switching magnetic field are also substantially determined by the shape magnetic anisotropy.

The switching magnetic field Hsw required to rewrite magnetization information of the recording layer is substantially given by the following expression (1).

$$Hsw = 4\pi \times Ms \times t/F (Oe) \qquad (1)$$

Here, Ms is a saturation magnetization of the recording layer, t is a thickness of the recording layer, and F is a width of the recording layer. Further, a sum Ku of the anisotropic energy based on a shape and the induced magnetic anisotropy is substantially given by the following expression (2).

$$Ku = Hsw \times Ms/2 \qquad (2)$$

As a method for reducing the write current, coating a conventional write wiring made of, e.g., Cu with a soft magnetic material such as NiFe and using it as a write wiring with a yoke is proposed in, e.g., Saied Tehrani, "Magneto resistive RAM", 2001 IEDM short course. According to this method, the approximately twofold high-efficiency effect, i.e., the write current value can be reduced to approximately ½.

FIG. 1 shows an example of a structure of the write wiring with a yoke described in the above cited reference ("Magneto resistive RAM"), and FIG. 2 shows a result of examining write characteristics obtained by using the write wiring illustrated in FIG. 1. As shown in FIG. 1, the write wiring with a yoke has a structure that a part of the periphery of a write wiring 30 made of Cu is coated with a yoke 20 made of a soft magnetic material such as NiFe.

In FIG. 2, characteristics A indicated by a solid line show a state that a width F of a recording layer is reduced and a switching magnetic field Hsw is increased as minuteness of an MTJ element is realized when a CoFeNi thin film having a film thickness of 2 nm is used as the recording layer.

In case of using the conventional write wiring (characteristics B), since the generated magnetic field is larger than the switching magnetic field until 1/F is approximately 7, writing is possible. On the other hand, in case of using the conventional write wiring with a yoke (characteristics C), since the generated magnetic field is larger than the switching magnetic field even if 1/F exceeds approximately 7, writing is possible, but the generated magnetic field is smaller than the switching magnetic field when 1/F exceeds approximately 10.

As a result of examining the case that write wiring with a yoke formed by a prior art is used based on an experiment and a computer simulation, the approximately twofold high-efficiency effect was confirmed, and the write current can be reduced to 5 mA. However, this is the limit, and it is far from 1 to 2 mA which is a target value required for a practical application.

Meanwhile, the measurements of the magnetoresistive effect when a GdFe alloy perpendicular magnetization film is used for a TMR film are reported by Ikeda et al., in "GMR and TMR films using GdFe alloy perpendicular magnetization film", Journal of Japan Applied Magnetization, Vol. 24, No. 4-2, 2000, pp. 563–566.

Moreover, as an example of a stacked structure of an MTJ element using perpendicular magnetization films, a stacked structure of magnetic layer (GdFeCo) (50 nm)/interface layer (CoFe)/tunnel barrier film ($Al_2O_3$) (2.2 nm)/interface layer (CoFe)/magnetic layer (TbFeCo) (30 nm) is disclosed in "Magnetic tunnel junction device with perpendicular magnetization films for high-density magnetic random access memory" by N. Nisimura, et al., Journal of Applied Physics, Vol. 91, No. 8, Apr. 15, 2002.

As described above, with the conventional MRAMs, it is desirable to both reduce the write current and overcome the thermal agitation property; however, no specific designs therefore have been proposed. Furthermore, with the conventional MRAMs, the write current further increases as the dimensions of the MTJ elements are scaled down; however, no specific means has been proposed which allows the write current to be reduced below about 1 mA in order to increase the capacity of the MRAM.

BRIEF SUMMARY OF THE INVENTION

According to a first aspect of the present invention, there is provided a magnetic random access memory device comprising: a perpendicular magneto-resistive element having a first and second magnetic layers and a nonmagnetic layer sandwiched between the first and second magnetic layers, the first magnetic layer forms a recording layer and the second magnetic layer forms a fixed layer, and each of the first and second magnetic layers being magnetized in a direction perpendicular to its plane; and a write wiring configured to place along a direction perpendicular to the direction of the thickness of the magnetoresistive element, the write wiring writes data into the magnetoresistive element by generating a magnetic field when supplied with a current and applying the generated magnetic field to the magnetoresistive element in the direction in which the magnetic layers are magnetized, the direction of magnetization of the recording layer being changed.

According to a second aspect of the present invention, there is provided an electronic card comprising: a semiconductor chip including a perpendicular magnetoresistive element having a first and second magnetic layers and a nonmagnetic layer sandwiched between the first and second magnetic layers, the first magnetic layers forms a recording layer and the second magnetic layer forms a fixed layer, and each of the first and second magnetic layers being magnetized in a direction perpendicular to its plane, and a write wiring, placed along a direction perpendicular to the direction of the thickness of the magnetoresistive element, which writes data into the magnetoresistive element by generating a magnetic field when supplied with a write current and applying the generated magnetic field to the magnetoresistive element in the direction in which the first and second magnetic layers are magnetized, the direction of magnetization of the recording layer being changed; a card body which houses the semiconductor chip and has a window on one side of the semiconductor chip; a shutter which opens and shuts the window of the card body and has the magnetic shielding effect; and a plurality of external terminals provided along at least one edge of the card body to electrically connect the semiconductor chip to a device external to the card body.

BRIEF DESCRIPTION OF THE SEVERAL VIEWS OF THE DRAWING

FIG. 10 is a side view illustrating still another structure of the MTJ element in FIG. 6;

FIG. 11 is a side view illustrating another structure of the magnetic yoke in FIG. 6;

FIG. 12 is a side view illustrating still another structure of the magnetic yoke in FIG. 6;

FIG. 13 is a side view illustrating a further structure of the magnetic yoke in FIG. 6;

FIG. 25 is a side view of FIG. 24;

FIG. 27 is a sectional view of a slide type of data transfer device as still another example of an electronic device of the present invention.

DETAILED DESCRIPTION OF THE INVENTION

Figure 1:
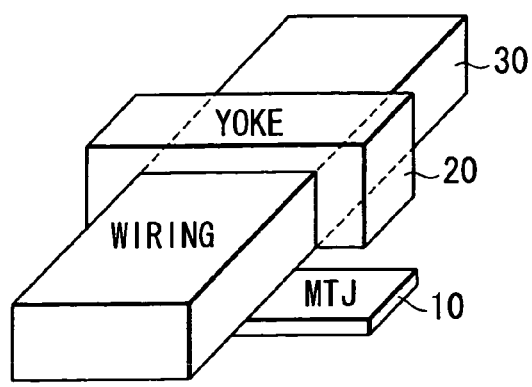
FIG. 1 is a perspective view illustrating the structure of a write wiring with a yoke.
Figure 2:
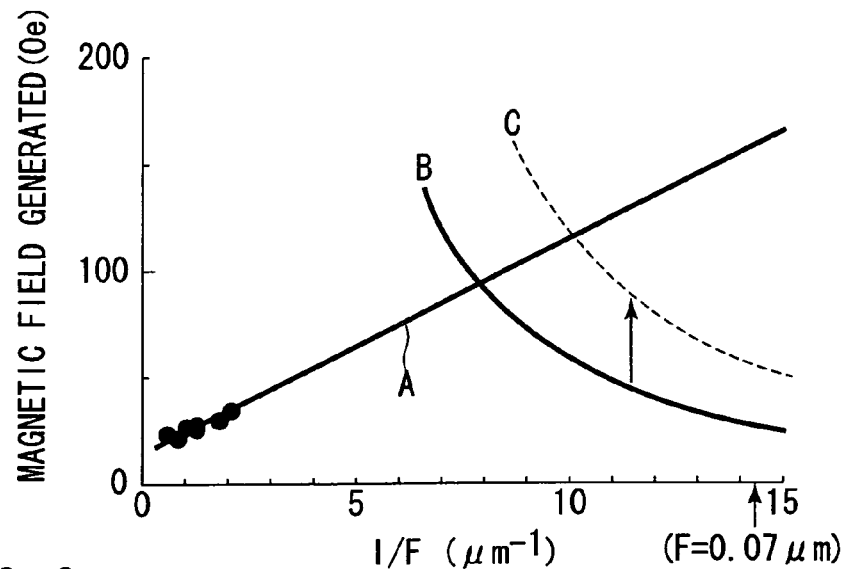
FIG. 2 shows the results of examination of the write characteristics using the write wiring shown in FIG. 1.
Figure 3:
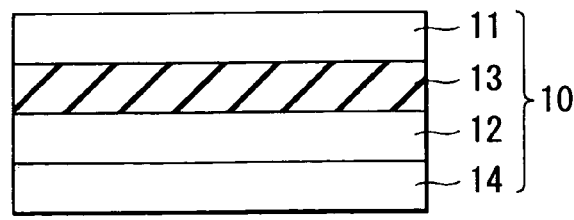
FIG. 3 is a schematic sectional view of an MTJ element used in an MRAM.

Before explaining embodiments according to the present invention, an MTJ element used in an MRAM device will be first described. FIG. 3 schematically shows a cross-sectional structure of the MTJ element. The MTJ element 10 has a structure in which one non-magnetic layer (tunnel barrier film) 13 is sandwiched between two magnetic layers 11 and 12 each made of a ferromagnetic layer or a ferromagnetic material film. The MTJ element stores a logic "1" level data or "0" level data depending on whether directions of magnetization of the two magnetic layers 11 and 12 are parallel or anti-parallel.

An anti-ferromagnetic layer 14 is arranged on the magnetic layer 12. The anti-ferromagnetic layer 14 is a member used to change only a direction of magnetization of the magnetic layer 11 by fixing a direction of magnetization of the magnetic layer 12, and thereby readily rewrite data. Here, the magnetic layer 12 whose direction of magnetization is fixed is referred to as a fixed layer or a pinned layer, and the magnetic layer 11 whose direction of magnetization is variable is referred to as a free layer or a recording layer.

Figure 4A:
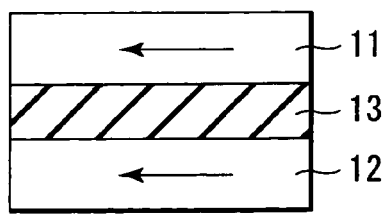
FIGS. 4A and 4B show the directions of magnetization of two magnetic layers in the MTJ element in FIG. 3.
Figure 4B:
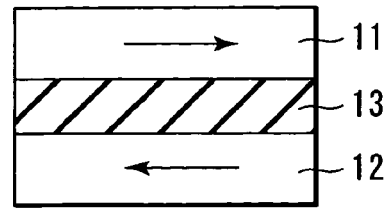

FIGS. 4A and 4B show two states of directions of magnetization of the two magnetic layers 11 and 12 of the MTJ element 10 depicted in FIG. 3.

As shown in FIG. 4A, when the directions (directions of arrows in the drawing) of magnetization of the two magnetic layers 11 and 12 are parallel (same), a tunneling resistance of the tunnel barrier film 13 sandwiched between the two magnetic layers 11 and 12 is lowest. In this case, a tunneling current is largest.

As shown in FIG. 4B, when the directions of magnetization of the two magnetic layers 11 and 12 are anti-parallel, the tunneling resistance of the tunnel barrier film 13 sandwiched between the two magnetic layers 11 and 12 is highest. In this case, the tunnel current becomes minimum.

In the MRAM device, the two states that the MTJ elements have different resistance values are associated with a data storage state on the logic "1" level (state "1") and a data storage state on the logic "0" level (state "0").

Figure 5:
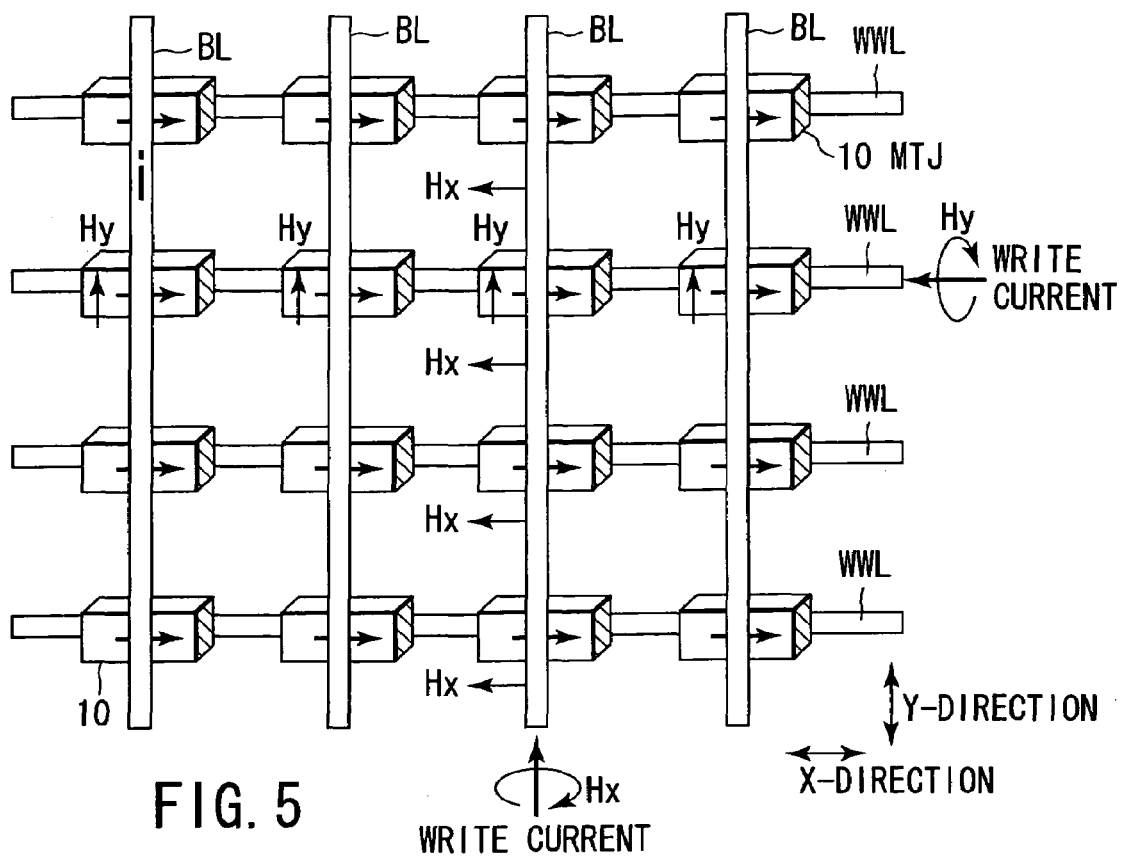
FIG. 5 is a schematic illustration of a layout of an MRAM cell array.

FIG. 5 typically shows an example of a plane layout of a cell array of the MRAM device constituted by two-dimensionally arranging a plurality of MTJ elements in a row direction and a column direction.

A plurality of write/read bit lines BL and a plurality of write word lines WWL are arranged in directions orthogonal to each other. Further, each MTJ element 10 is arranged in accordance with an intersection between each bit line BL and each write word line WWL. To each MTJ element 10 is given a magnetization direction along a direction of a long side of a rectangular in such a manner that the long side of the rectangular is parallel with the write word line WWL and a short side of the same is parallel with the bit line BL. Each bit line BL is electrically connected to one magnetic layer (reference numeral 11 or 12 in FIG. 3) of each of a plurality of the MTJ elements 10 in the same row (or column). Each write word line WWL is arranged so as to be opposed to the other magnetic layer (reference numeral 12 or 11 in FIG. 3) of each of a plurality of the MTJ elements in the same column (or row) in close proximity. These MTJ elements are formed on the surface of a semiconductor substrate made of, say, silicon and integrated into a single chip.

[First Embodiment of MRAM]

Figure 6:
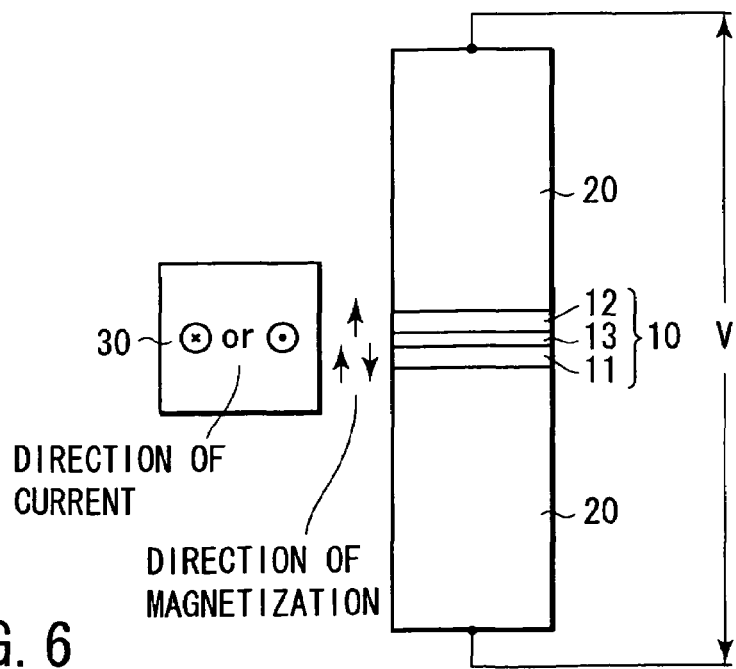
FIG. 6 is a side view illustrating the basic configuration of an MTJ element according to a first embodiment of the present invention and a positional relationship between the magnetic yoke and the write wiring.

FIG. 6 schematically shows, in side view, the basic configuration of an MTJ element used as an MRAM cell in an MRAM according to a first embodiment of the present invention and the arrangement of its associated magnetic yokes and write wiring.

In FIG. 6, the MTJ element 10 has a stacked structure such that between a recording layer 11 called a free layer and a fixed layer 12 called a fixed magnetization layer or pinned layer is sandwiched a tunnel barrier layer 13. The recording layer and the fixed layer are each made of a magnetic material, whereas the tunnel barrier layer consists of a non-magnetic material. The MTJ element 10 has the tunneling magnetoresistive (TMR) effect and is formed into a perpendicular type of MTJ element in which the magnetic layers 11 and 12 are magnetized in the direction perpendicular to their surface. Here, the tunnel barrier layer 13 is formed of aluminum oxide ($Al_2O_3$).

The MTJ element 10 is sandwiched between the magnetic yokes 20 in the direction of its thickness. The magnetic yokes 20 apply a magnetic field generated by a write wiring 30 to be described later to the magnetic layers 11 and 12 in the direction of the thickness. The magnetic yokes 20 are each made of a soft magnetic material. In this embodiment, the MTJ element 10 is in contact with each of the yokes 20; however, a metal such as Ta or an insulating material such as MgO may be provided at the interface of the MTJ element and the yoke.

The write wiring 30 is located in close proximity to the MTJ element 10 along its side in the direction of the thickness. The write wiring 30 generates a magnetic field and applies it to the MTJ element 10 in the direction perpendicular to the surface of the magnetic layers 11 and 12 (in the direction in which they are magnetized). The write wiring 30 is made of, say, Cu or Al.

That is, the MRAM cell of the first embodiment is configured such that the MTJ element 10 has two magnetic layers and a non-magnetic layer sandwiched between the magnetic layers, the magnetic layers are magnetized in the direction perpendicular to their surface, and the resistance that varies with the magnetized states of the magnetic layers is made to correspond to a 0 or 1 of data. To write data, a magnetic field resulting from current flowing through the write winding 30 placed in close proximity to the MTJ element 10 is applied to the MTJ element 10 in the direction of magnetization of the magnetic layers so that the direction of magnetization of one of the two magnetic layers is changed.

[Example of Magnetic Yoke]

Figure 7:
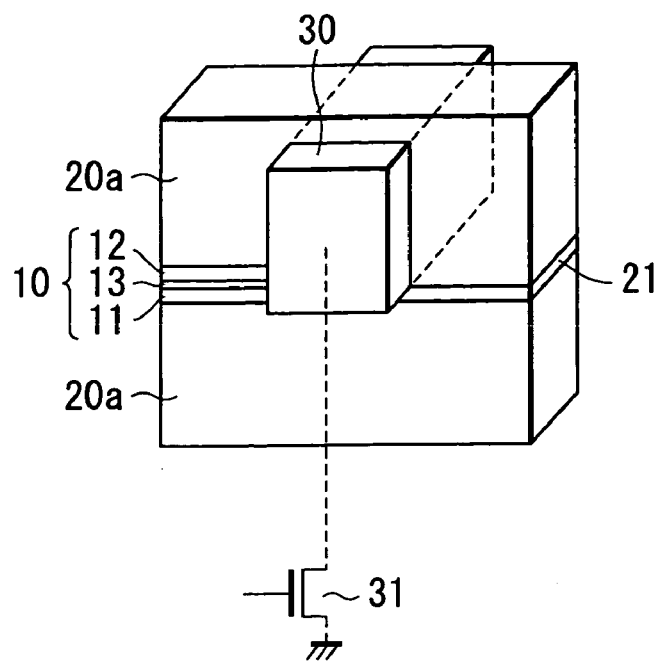
FIG. 7 is a perspective view illustrating a structure of the magnetic yoke in FIG. 6.

FIG. 7 shows a specific example of the magnetic yokes 20 of FIG. 6. Yokes 20 are provided which have a completely closed magnetic path configuration which surrounds the write winding 30. The perpendicular MTJ element 10 is inserted into a portion of the yokes 20a. In this case, an electrically insulating film 21 is inserted in a portion of the closed magnetic path. Another electrically insulating film is inserted between the yoke 20a and the write wiring 30 as well. The yokes 20a form a part of a current path that allows current to flow through the MTJ element 10 in reading stored data from the MTJ element.

Next, the principles of the operation of writing into the MTJ element 10 shown in FIGS. 6 and 7 will be described. Writing into the MTJ element 10 is achieved by causing a current in the form of a pulse to flow through the write wiring 30 in a first direction or a second direction opposite to the first direction depending on write data and aligning the magnetization of the recording layer 11 parallel or antiparallel to that of the fixed layer 12 using a resulting magnetic field. In this write operation, the magnetic flux in the magnetic yoke 20 is converged in the recording layer 11 of the MTJ element 10, thus allowing the write current to be reduced significantly.

Reading from the MTJ element 10 is achieved by forming a current path that allows current to flow through the MTJ element, applying a predetermined read voltage V across the MTJ element 10 to allow a current corresponding to its resistance to flow through the current path, and detecting the value of that current with a sense amplifier.

According to our experiments, in writing into the perpendicular MTJ element, when the same current as in writing into the conventional MTJ element was applied to the write wiring, the magnitude of a magnetic field generated in the MTJ element and the efficiency of generating the magnetic field were increased by a factor of more than 100. This means that the current value required to generate the same magnetic field as in the prior art is reduced by a factor of more than 100.

Even if the write magnetic field is increased, however, in order to magnetize a thin magnetic layer in the direction perpendicular to its surface, it is usually required for the magnetic layer to have a perpendicular magnetic anisotropic energy greater than its static magnetic energy $2 \pi Ms^2$. Thus, the switching magnetic field is required to be as large as thousands of Oe and, as a result, the write current will not be reduced.

By putting the MTJ element 10 between the magnetic yokes 20 in the direction of thickness as shown in FIG. 6, the static magnetic energy can be reduced significantly. Thus, the magnetic layer can be magnetized in the direction perpendicular to its surface even if the perpendicular magnetic anisotropic energy Ku is lowered and consequently the switching magnetic field is decreased below 100 Oe.

Thus, the MRAM cell of the present embodiment has a switching magnetic field which is approximately three times as large as the switching magnetic field of the conventional MRAM cell which is about 30 Oe. As a consequence, the write current value can be reduced to 1/30 of the conventional write current value, i.e., about 0.3 mA.

As described above, the shape magnetic anisotropy and the induced magnetic anisotropy are dominated as the magnetic anisotropy. Assuming single magnetic domain and if their magnetization is switched simultaneously, the switching magnetic field Hsw can be described by expression (1).

In the present embodiment, in order to magnetize the magnetic layers in the direction perpendicular to their surface, vertical magnetic anisotropy is required. When crystalline magnetic anisotropy is used as this magnetic anisotropy, the anisotropy will not be affected by shape. Therefore, even if the pattern size of the magnetic film is made small, the switching magnetic field Hsw remains, in principle, unchanged. It is not until a perpendicular magnetization film is used as the magnetic film that microstructuring becomes possible.

Since the switching magnetic field is not increased even if the dimensions of the MTJ element 10 are scaled down as described above, it becomes possible to implement an MRAM having fine MTJ elements of less than 90 nm and a capacity of, say, 256 Mbits or more, which is not feasible with the conventional MRAMs.

According to the first embodiment, to write data into the MTJ element 10, a write magnetic field is simply applied in the direction perpendicular to the surface of the magnetic layers of the MTJ element. The MTJ element 10 can be held by the magnetic yokes 20 in the direction of the element thickness. Moreover, the width of the gap between the magnetic yokes 20 into which the MTJ element is inserted is substantially equal to the thickness of the MTJ element, which is small enough to allow the magnetic field generating efficiency to be increased significantly.

In addition, the need for the antiferromagnetic material required of the conventional MTJ element is eliminated, resulting in reduced thickness of the MTJ element 10 and consequently in increased efficiency of write magnetic field generation. In the conventional MTJ element, an Mn-based alloy is used as the antiferromagnetic layer. In this case, Mn diffuses at temperatures of 300° C. or above, which leads to a problem of degradation of the rate of change of resistance (MR ratio). In contrast, when the need of using the antiferromagnetic layer is eliminated as in the present embodiment, the degradation of MR due to Mn diffusion can be eliminated.

Furthermore, since the switching magnetic field Hsw does not depend on the surface width of the MTJ element 10, it is unnecessary to have concern about insufficient switching magnetic field involved in scaling the MTJ element. Additionally, since the static magnetic energy based on to the demagnetizing field of the magnetic yokes 20 in the direction perpendicular to he surface of the magnetic layer of the MTJ element can be reduced, the magnetic layers can be magnetized in the direction perpendicular to their surface even with small switching magnetic fields.

An MRAM can therefore be implemented which can decrease the write current value to MRAM cells to a practical level, can eliminate variations in switching current value due to variations in shape, can overcome thermal agitation property, and can reduce the write current value.

[MRAM Cell Select Transistor]

For example, as indicated by a broken line in FIG. 7, a MOS transistor 31 for selecting a cell to be written into can also be connected to the write wiring 30. The connection of the MOS transistor 31 allows selection of the MTJ element 10 in an MRAM cell to be selected and separation from other MRAM cells which are not selected. In this case, if the write current value can be set to submilliamperes owing to the advantages obtained in the aforementioned embodiment, the select transistor 31 can be implemented as small as the MTJ element 10 and can be incorporated into the memory cell array.

This eliminates the occurrence of cells in half-selected state, allowing write errors to be eliminated. Moreover, the problem of thermal agitation of half-selected cells can also be resolved. Furthermore, a thermal assist recording method can be adopted which writes into a selected cell while heating it with write current. This allows scaling of the MTJ element 10 to dimensions of the order of 50 nm; thus, the feasibility of substituting an MRAM for a DRAM increases.

In the conventional thermal assist recording method, on the other hand, since there is no concept of making a selection from cells on writing, other cells than a selected one are subjected to some heat, which forms a factor of causing the switching of magnetization of recording layers due to thermal agitation.

The performance of the MTJ element 10 having such a basic configuration as shown in FIG. 6 can be enhanced by using a high Hc magnetic material having a high coercive force for the fixed layer 12 and a low Hc magnetic material which is lower in coercive force than the fixed layer 12 for the recording layer 11. In this case, Hc can be adjusted properly by selecting the high Hc magnetic material and the low Hc magnetic material properly.

As the high Hc magnetic material, materials are desirable which have a crystalline magnetic anisotropy energy density of $1 \times 10^6$ erg/cc or more. The specific examples are mentioned below.

(1) Alloys which contain at least one element of Fe (iron), Co (cobalt), and Ni (nickel) or contain at least one element of Fe, Co and Ni and at least one element of Cr (chromium), Pt (platinum), and Pd (palladium). These alloys include ordered alloys and disordered alloys. The ordered alloys include Fe(50)Pt(50), Fe(50)Pd(50), and Co(50)Pt(50). The disordered alloys include Co/Cr alloys, Co/Pt alloys, Co/Cr/Pt alloys, Co/Cr/Pt/Ta alloys, and Co/Cr/Nb alloys.

(2) Alternate layers of at least one element selected from Fe, Co, and Ni or an alloy that contains the selected one element and one element selected from Pd and Pt or an alloy that contains the selected one element. For example, Co/Pt superlattices, Co/Pd superlattices, and CoCr/Pt superlattices are included. If the Co/Pt or Co/Pd superlattices are used, the rate of change of resistance (the MR ratio) will have a value as high as 40%.

(3) Amorphous alloys as disclosed in the previously cited literature "Magnetic tunnel junction device with perpendicular magnetization films for high-density magnetic random access memory", which contain at least one element of rare earth metals, such as Tb (terbium), Dy (dysprosium), and Gd (gadolinium), and at least one element of transition metals. These amorphous alloys include TbFe, TbCo, TbFeCo, DyTbFeCo, and GdTbCo. Amorphous alloys having their composition adjusted to the vicinity of the room temperature as the compensation temperature are more desirable.

Meanwhile, the low Hc magnetic material is one which has its magnetic anisotropic energy made lower than that of the high Hc magnetic material by composition ratio adjustment, impurity addition, thickness adjustment, etc. Specific examples of low Hc magnetic materials are mentioned below.

(1) Alloys which contain at least one element of Fe, Co, and Ni or contain at least one element of Fe, Co and Ni and at least one element of Cr, Pt, and Pd. In the case of ordered alloys, Fe(50)P(50), Co(50)Pt(50), etc. are added with an impurity element, such as Cu (copper), Cr, Ag (silver), etc., or its alloy or an insulating material to lower the magnetic anisotropic energy density. In the case of disordered alloys, the percentage of the nonmagnetic element is increased to lower the magnetic anisotropic energy density.

(2) Stacked structures in which a layer containing at least one element of Fe, Co, and Ni and a layer containing one element of Pd and Pt are stacked alternately and one of the two layers is made thicker than the other. In practice, each of the two layers has the optimum thickness. Outside the optimum thickness, the magnetic anisotropy energy density decreases. That is, in some structures, the thickness is smaller than the optimum value.

(3) Amorphous alloys, as disclosed in the previously cited literature "Magnetic tunnel junction device with perpendicular magnetization films for high-density magnetic random access memory", which contain at least one element of rare earth metals, such as Tb (terbium), Dy (dysprosium), and Gd (gadolinium) and at least one element of transition metals.

[First Example of MTJ Element]

Figure 8:
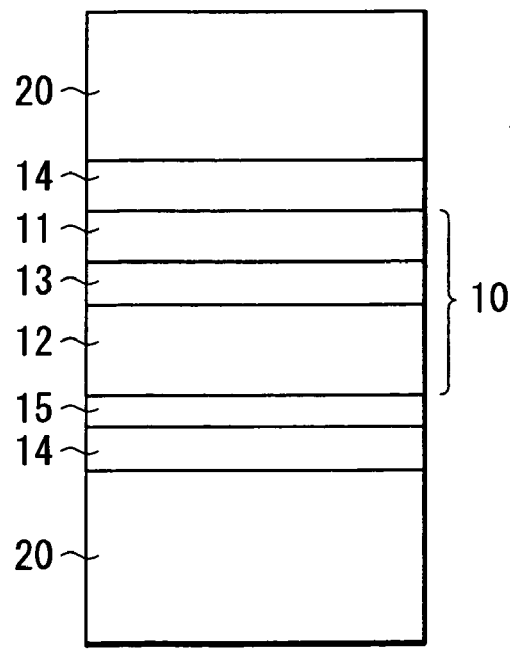
FIG. 8 is a side view illustrating a structure of the MTJ element in FIG. 6.

FIG. 8 is a side view illustrating a specific example of the MTJ element 10 in FIG. 6. In locating the MTJ element 10 on the magnetic material for the yoke, in order to prevent diffusion and break exchange coupling, underlayers of suitable materials, such as Ta (tantalum), TiN, TaN, etc., may be provided on the magnetic material.

With an ordered alloy (FePt or CoPt) used as the fixed layer 12 having a high coercive force, in order to produce the perpendicular magnetic anisotropy, it is required to orientation of the fct(001) plane. To this end, as the underlayer to achieve the fct(001) orientation, use may be made of ultra thin underlayer of the order of several nanometers consisting of MgO (magnesium oxide). In addition, elements and compounds having the fcc or bcc structure and a lattice constant of 0.28, 0.40, or 0.56 nm, such as Pt, Pd, Ag, Au, Al, Cr, etc., can be used.

When a Co/Pt superlattice is used as the recording layer 11 having a low coercive force, the coercive force can be adjusted by adjusting the thick nesses of Co and Pt.

A first example of the stacked layer structure of the MTJ element is as follows:

The lower yoke 20 is made of NiFe. The underlayer 14 is made of Ta and has a thickness of 2 nm. The underlayer 15 to control the crystalline orientation is made of MgO and has a thickness of 1 nm. The fixed layer 12 is made of FePt and has a thickness of 5 nm. The tunnel barrier film 13 is made of AlO and is 1.2 nm in thickness. The recording layer 11 is a Co/Pt superlattice with a Co thickness of 0.5 nm and a Pt thickness of 1.5 nm. The underlayer 14 is made of Ta and is 2 nm in thickness. The upper yoke 20 consists of NiFe.

At the interface of the tunnel barrier film 13 and Co of the recording layer 11, a layer of Pt may be inserted to the thickness that the MR ratio is not impaired. Instead of using the FePt order alloy layer, a layer of CoPt disorder alloy may be used as the fixed layer 12. As the recording layer 11 a Co/Pd superlattice may be used in place of the Co/Pt superlattice. The tunnel barrier film 13 may be made of MgO, not AlO as described above.

[Second Example of MTJ Element]

Figure 9:
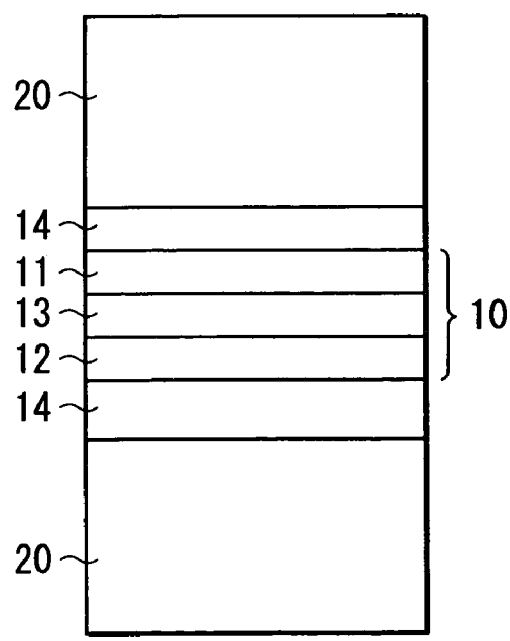
FIG. 9 is a side view illustrating another structure of the MTJ element in FIG. 6.

FIG. 9 is a side view illustrating a specific example of the MTJ element 10 in FIG. 6. Each of the fixed layer 12 and the recording layer 11 of the MTJ element 10 may be formed of a superlattice.

An example of the stacked MTJ structure in this case is as follows:

The lower yoke 20 consists of NiFe. The underlayer 14 consists of Ta and has a thickness of 2 nm. The fixed layer 12 consists of a Co/Pt superlattice with a Pt thickness of 0.8 nm and a Co thickness of 0.3 nm. The tunnel barrier film 13 consists of AlO and is 1.2 nm in thickness. The recording layer 11 consists of a Co/Pd superlattice with a Co thickness of 0.5 nm and a Pd thickness of 1.5 nm. The underlayer 14 consists of Ta and is 2 nm in thickness. The upper yoke 20 consists of NiFe.

In this case as well, at the interface of the tunnel barrier film 13 and Co of the recording layer 11, a layer of Pt or Pd may be inserted to the thickness that the MR ratio is not impaired.

[Third Example of MTJ Element]

As the fixed layer 12 or the recording layer 11 of the MTJ element 10, use may be made of an amorphous alloy of a rare earth metal and a transition metal. The stacked structure of the MTJ element in this case remains unchanged from that shown in FIG. 9.

An example of the stacked structure is as follows:

The lower yoke consists of NiFe. The underlayer consists of Ta and has a thickness of 2 nm. The fixed layer consists of Tb(22)(Fe(71)Co(29))(78) of a thickness of 20 nm. The tunnel barrier film consists of AlO and is 1.2 nm in thickness. The recording layer consists of a Co/Pd superlattice with a Co thickness of 0.5 nm and a Pd thickness of 1.5 nm. The underlayer consists of Ta and is 2 nm in thickness. The upper yoke consists of NiFe.

At the interface of the fixed layer consisting of Tb(22) (Fe(71)Co(29))(78) and the tunnel barrier layer consisting of AlO, a layer of, say, Co may be provided for exchange coupling. The fixed or recording layer may be formed into a stacked structure of an amorphous alloy of a rare earth metal and a transition metal, such as TbFeCo/Pt/Co, a nonmagnetic metal, such as Pt or Pd, and Co.

[Fourth Example of MTJ Element]

The recording layer 11 of the MTJ element 10 may be situated on the lower yoke side. An example of the stacked structure of the MTJ element in this case is as follows:

The lower yoke consists of NiFe. The underlayer consists of Ta and has a thickness of 2 nm. The recording layer consists of a composite film of CrTi of 10 nm in thickness and Co(74)Cr(16)Nb(10) of 10 nm in thickness. The tunnel barrier film consists of AlO and is 1.2 nm in thickness. The fixed layer consists of a Co/Ru superlattice with a Co thickness of 0.3 nm and an Ru thickness of 0.8 nm. The underlayer consists of Ta and is 2 nm in thickness. The upper yoke consists of NiFe.

[Fifth Example of MTJ Element]

The fixed layer 12 of the MTJ element 10 may be formed into a synthetic antiferromagnetic structure in which a magnetic layer and a metal layer are stacked alternately. The magnetic layers include layers of Fe, Co, Ni, and their alloys. The metal layers include layers of Ru, Ir, Rh, Re, and Os. Specific examples of the synthetic antiferromagnetic structures include Co/Ru, Co/Ir, and Co/Rh. An example of the stacked structure of the MTJ element in this case is as follows:

The lower yoke consists of NiFe. The underlayer consists of Ta and has a thickness of 2 nm. The recording layer consists of a composite film of CrTi of 10 nm in thickness and Co(74)Cr(16)Nb(10) of 10 nm in thickness. The tunnel barrier film consists of AlO with a thickness of 1.2 nm. The fixed layer consists of a Co/Ru superlattice with a Co thickness of 0.3 nm and a Ru thickness of 0.8 nm. The underlayer consists of Ta with a thickness of 2 nm. The upper yoke consists of NiFe.

[Sixth Example of MTJ Element]

For each of the magnetic layers 11 and 12 of the MTJ element 10 may be made of a ferrimagnetic material or a synthetic antiferromagnetic structure. Ferrimagnetic materials include amorphous alloys of at least one element of rare earth metals, such as Gd and Tb, and at least one element of transition metals, which are exemplified by GdCo, TbFeCo, and GdTbFe; a synthetic antiferromagnetic structure of at least one of Fe, Co and Ni and one of V (vanadium), Cr, Cu, Nb (niobium), Mo (molybdenum), Ru (ruthenium), Rh (rhodium), Pd, Ta, W (tungsten), Re (rhenium), Os (osmium), Ir (iridium), Pt, and Au; and materials using Mn (manganese), Cu, Al, Ge (germanium), and Bi (bismuth), such as MnBi, MnAlge, MnCuBi, et.

When a ferrimagnetic layer is used for the recording layer of the MTJ element, perpendicular static magnetic energy can be reduced, a perpendicular recording layer with a small switching magnetic field can be implemented, and a self-bias magnetic field across the magnetic yokes can be reduced, allowing a current value required at overwrite time to be reduced.

When a ferrimagnetic material is used for the fixed layer of the MTJ element, a bias magnetic field across the recording layer 11 can be reduced, allowing the offset magnetic field to be reduced.

[Seventh Example of MTJ Element]

FIG. 10 shows a specific example of the MTJ element 10 in FIG. 6. In this MTJ element, Co, Ni, Fe, or an alloy (CoFe, NiFe, NiCo, or FeCoNi) is placed at each of the interface between the magnetic layer 11 and the tunnel barrier film 13 and the interface between the magnetic layer 12 and the barrier film 13, i.e., at the two barrier interfaces. Except for this point, the MTJ element remains unchanged from the MTJ element in FIG. 6 and corresponding parts to those in FIG. 6 are denoted by like reference numerals. This configuration allows the rate of change of resistance MR of the MTJ element to be improved.

[First Example of Magnetic Yoke]

FIG. 11 shows a specific example of the magnetic yokes 20 in FIG. 6. Each magnetic yoke has its yoke tip 42 on the MTJ element side of the yoke body (body of a soft magnetic material) 41 formed of a material, such as FeCo, CoFe, Fe(1−x)Nx, or the like, which has a high saturation magnetic flux density (Bs).

The magnetic yokes thus configured allow the write magnetic field and the write efficiency to be increased. The MTJ element in FIG. 11 is configured identically to that shown in FIG. 10 and corresponding parts to those in FIG. 10 are denoted by like reference numerals.

[Second Example of Magnetic Yoke]

When the sectional shape of the magnetic yokes 20 in the first example is formed so that the magnetic flux converges on the MTJ element 10, not only the write efficiency is improved but also the leakage of magnetic flux from bending portions of the yokes is eliminated. For this reason, magnetic fields applied to adjacent MTJ elements can be lowered and a problem of erroneous writing can be resolved.

FIG. 12 shows a specific example of the magnetic yokes 20 in FIG. 6. The area of the yoke tip 42a on the side of the fixed layer 12 of the MTJ element 10 is made equal to that of the fixed layer 12. In contrast, the area of the yoke tip 42b on the side of the recording layer 11 is made larger than that of the recording layer 11. The yoke area on the recording layer side is set larger than that on the fixed layer side. The MTJ element in FIG. 12 is configured identically to that in FIG. 11 and corresponding parts to those in FIG. 11 are denoted by like reference numerals.

The magnetic yokes thus configured allow the write efficiency to be improved and the write current to be reduced, say, to be halved in comparison with the magnetic yokes 20 shown in FIG. 11.

[Third Example of Magnetic Yoke]

FIG. 13 shows a specific example of the magnetic yokes 20 in FIG. 6. The area of the yoke tip 42a on the fixed layer side of the MTJ element 10 is made equal to that of the fixed layer 12 and the area of the yoke tip 42b on the recording layer side is made equal to that of the recording layer 11. The yoke area on the recording layer side, i.e., the area of the yoke body 41b is set larger than that on the fixed layer side, i.e., the yoke area 41a. The MTJ element in FIG. 13 is configured identically to that in FIG. 11 and corresponding parts to those in FIG. 11 are denoted by like reference numerals.

The magnetic yokes thus configured allows the write efficiency to be improved and the write current to be reduced, say, to be halved in comparison with the magnetic yokes 20 shown in FIG. 11.

[Second Embodiment of MRAM Cell]

Figure 14:
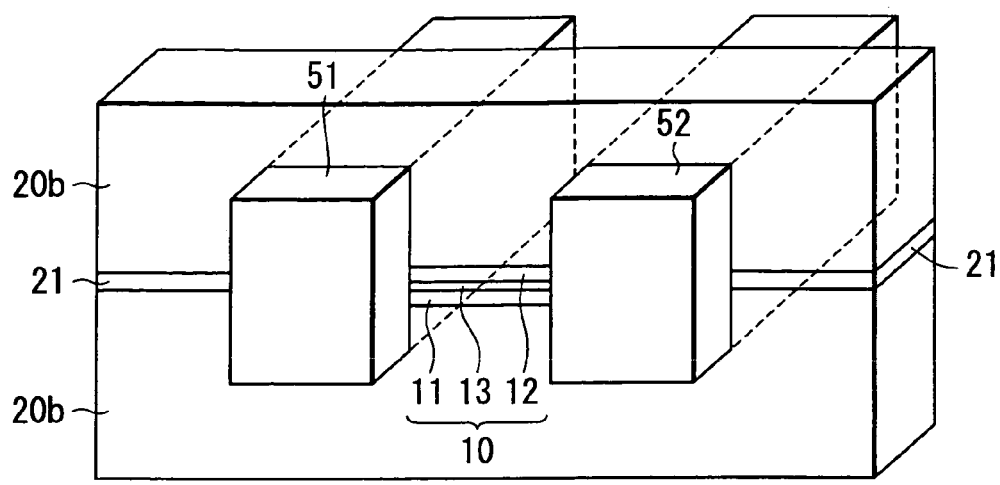
FIG. 14 is a perspective view illustrating the configuration of an MRAM cell according to a second embodiment of the present invention.

FIG. 14 is a perspective view of an MRAM cell according to a second embodiment of the present invention. With this MRAM cell, two write wirings 51 and 52 are arranged on the opposite sides of one perpendicular MTJ element 10. Magnetic yokes 20b having a completely closed magnetic path structure in the shape of, say, eyeglasses are provided to surround the write wirings 51 and 52. The MTJ element 10 is held in the direction of the thickness in that portions of the yokes 20b that are located midway between the write wirings 51 and 52. In FIG. 14, as an example there is shown an MTJ element which has the same structure as the MTJ element shown in FIG. 6 and corresponding parts to those in FIG. 6 are denoted by reference numerals.

Such a configuration in which the two write wirings 51 and 52 generate magnetic fields allows the magnetic field applied to the MTJ element to be increased in comparison with the MRAM cell shown in FIG. 6 even if the write current per wiring is equal. In other words, when the magnetic field applied to one MTJ element is set constant in both the configurations of FIGS. 6 and 14, the write current per wiring in the configuration of FIG. 14 can be reduced, for example, halved in comparison with that in the configuration of FIG. 6.

In the configuration of FIG. 14, it is possible to selectively subjecting the MTJ element to a magnetic field generated when a current is caused to flow in one of the two write wirings 51 and 52 or a magnetic field generated when currents are caused to flow in the two write wirings in opposite directions.

[Third Embodiment of MRAM Cell]

Figure 15:
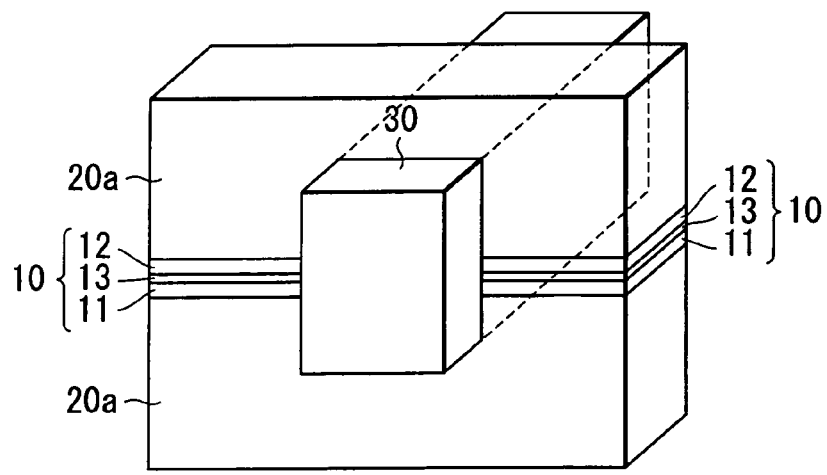
FIG. 15 is a perspective view illustrating the configuration of an MRAM cell according to a third embodiment of the present invention.

FIG. 15 is a perspective view of an MRAM cell according to a third embodiment of the present invention. With this MRAM cell, perpendicular MTJ elements 10 are arranged on opposite sides of a write wiring 30. Two MTJ elements 10 are inserted into two portions of the magnetic yokes 20a, which has a completely closed magnetic path structure that surrounds the write wiring, on the opposite sides of the write wiring 30. The MTJ element 10 in FIG. 15 is merely exemplary. Here, the MTJ element is shown as having the same structure as that in FIG. 6 and hence the same reference numerals as in FIG. 6 are used.

Such a configuration as shown in FIG. 15 allows the two MTJ elements 10 to be magnetized parallel and antiparallel. Since the bias field emanating from the fixed layer 12 is cancelled out, the offset magnetic field is attenuated. To dead data from one of the two MTJ elements 10, the electrically insulating films 21 shown in FIG. 7 may sandwich this MTJ element 10.

[Fourth Embodiment of MRAM Cell]

Figure 16:
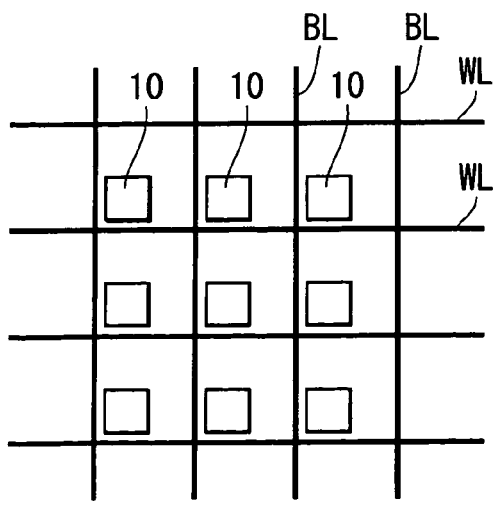
FIG. 16 is a circuit diagram of a memory cell array according to a fourth embodiment of the present invention.
Figure 17:
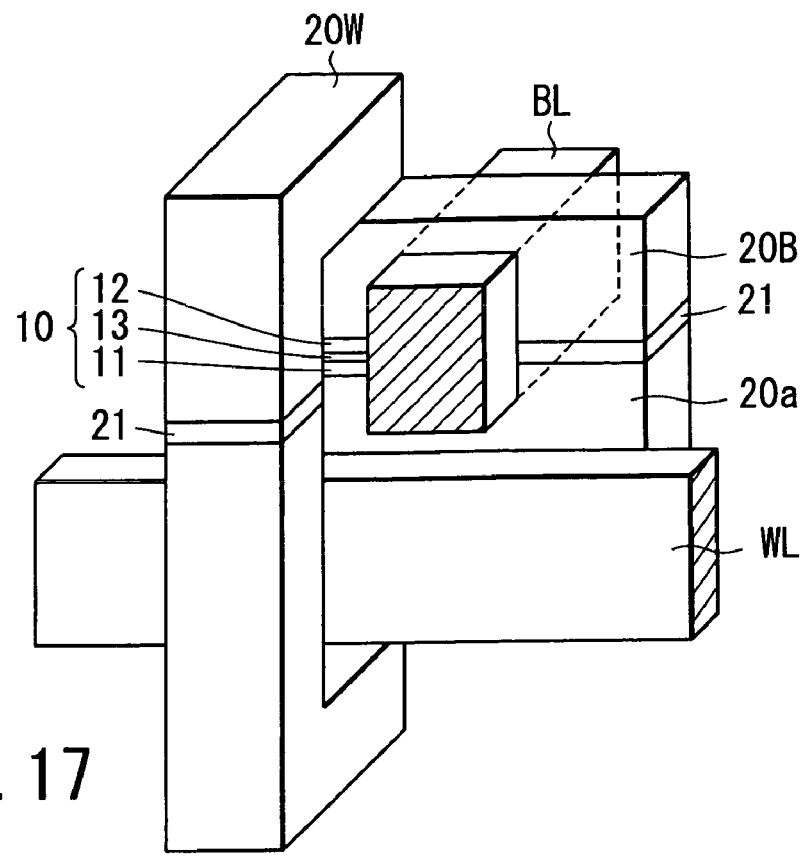
FIG. 17 is a perspective view illustrating one MRAM cell in the memory cell array of FIG. 16 and a positional relationship between the write wiring and the magnetic yoke.

FIGS. 16 and 17 show an MRAM cell array and an MRAM cell according to a fourth embodiment of the present invention. FIG. 16 shows a portion of the memory cell array, while FIG. 17 shows a configuration of one MRAM cell, a write wiring and magnetic yokes in the memory cell array of FIG. 16.

In the fourth embodiment, perpendicular MTJ elements 10 as described in the first embodiment are arranged in rows and columns on a semiconductor layer, for example, a semiconductor silicon substrate to make up a cell array. In this case, a word line WL as a first write wiring is arranged in the row direction so that it comes close to the side of each of the MTJ elements in the same row in a direction perpendicular to the direction of their thickness. A bit line BL as a second write wiring is arranged in the column direction so that it comes close to the side of each of the MTJ elements in the same column in a direction perpendicular to the direction of their thickness. Thereby, one MTJ element is placed in the vicinity of an intersection of the word line WL and the bit line BL.

As shown in FIG. 17, for the MTJ element 10, there are provided a first magnetic yoke 20B having a completely closed magnetic path structure which surrounds the bit line BL and a second magnetic yoke 20W having a completely closed magnetic path structure which surrounds the word line WL. In this case, the first magnetic yoke 20B and the second magnetic yoke 20W are provided at right angles to each other for each MTJ element. The MTJ element is held by the first magnetic yoke 20B in the direction of its thickness. The first magnetic yoke 20B is held by the second magnetic yoke 20W in the direction of the thickness of the MTJ element.

With the configuration of FIG. 17, one MTJ element 10 is subjected to a magnetic field or fields through only the first magnetic yoke 20B, or through only the second magnetic yoke 20W, or through both the first and second magnetic yokes 20B and 20W.

The MTJ element 10 in FIG. 17 is merely exemplary. Here, the MTJ element is shown as having the same structure as that in FIG. 6 and hence the same reference numerals as in FIG. 6 are used.

Such a configuration as allows the two write wirings WL and BL arranged at right angles to each other to selectively generate magnetic force to the MTJ element 10 allows the generated magnetic field to be increased in comparison with the MRAM cell shown in FIG. 6 even if the write current per wiring is equal. In other words, when the magnetic field applied to one MTJ element is set constant in both the configurations of FIGS. 6 and 17, the write current per wiring in the configuration of FIG. 17 can be reduced, for example, halved in comparison with that in the configuration of FIG. 6. In this case, only when each of the word line WL and the bit line BL is supplied with a write current simultaneously, the MTJ element placed at the intersection of the word line WL and the bit line BL can be written into, thus eliminating the needs of providing a cell select transistor for each MTJ element.

[Fifth Embodiment of MRAM Cell]

Figure 18:
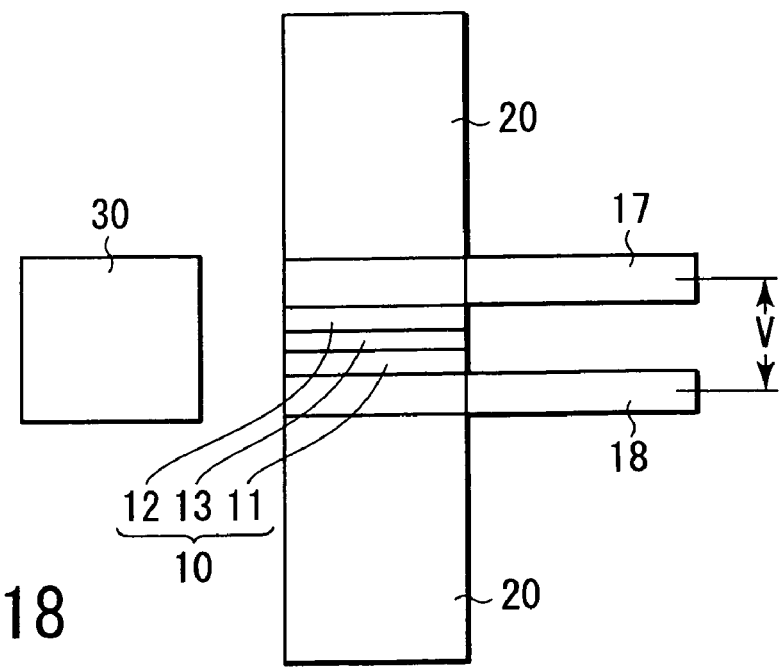
FIG. 18 is a side view of an MRAM cell according to a fifth embodiment of the present invention.

FIG. 18 is a side view of an MRAM cell according to a fifth embodiment of the present invention. With this MRAM cell, a pair of electrically conductive read wirings 17 and 18 has their respective portions inserted between the magnetic layer 11 of the perpendicular MTJ element 10 and the magnetic yoke 20 and between the magnetic layer 12 of the perpendicular MTJ element 10 and the magnetic yoke 20.

In reading stored data from the MTJ element 10, when a predetermined read voltage V is applied to the MTJ element 10 through the paired read wirings 17 and 18, a current the magnitude of which corresponds to the stored data flows through the MTJ element 10. The paired read wirings 17 and 18 form part of the current path at the stored data read time.

[Sixth Embodiment of MRAM Cell]

An MRAM cell according to a sixth embodiment differs from the configurations shown in FIGS. 6 and 7 only in that the magnetic yokes are omitted.

In the previously cited literature "Magnetic tunnel junction device with perpendicular magnetization films for high-density magnetic random access memory", the perpendicular magnetic anisotropy energy, Ku, of rare-earth and transition-metal (RE-TM)-based materials for the magnetic layers of the MTJ element is described as being generally of the order of $10^5$ to $10^6$ erg/cc and its saturation magnetization as being adjusted 0 to 150 emu/cc. The saturation magnetization Ms of Co is 1420 emu/cc and its uniaxial magnetic anisotropy energy is $4.5 \times 10^6$ erg/cc. The RE-TM material (30 nm) in the magnetic layer and Co in the interface layer are described as being exchange coupled ferromagnetically. Supposing that the thickness of the Co film is 1/10 of that of the RE-TM material layer and the Co film and the RE-TM material layer contribute to the effective anisotropy energy Keff and the effective saturation magnetization Meff according to their respective volume percentages, Keff and Meff can be estimated to be $10^5$ to $10^6$ erg/cc and 0 to 270 emu/cc, respectively.

When the direction of magnetization of a magnetic layer is switched by rotation of magnetization while it retains a single magnetic domain structure, the coercive force of the magnetic layer is expected to be 2 Ku/Ms and estimated to be of the order of 700 to 10000 Oe. With the magnetic layer described in the previously cited literature "Magnetic tunnel junction device with perpendicular magnetization films for high-density magnetic random access memory", the coercive force is about 250 Oe, which is smaller than the anticipated value, 2 Ku/Ms. The reason is that the cell size is as large as 85 micrometers square and hence the switching of magnetization is expected to occur due to the movement of magnetic domain walls. When an experimental MTJ element of 0.3 μm in diameter was actually manufactured, the coercive force was 1.5 kOe.

With a configuration without yokes, i.e., a write wiring which is not covered with yokes, the magnetic field strength generated by a current flow of 1 mA through that wiring is of the order of 10 Oe at most. With the configuration disclosed in the previously cited literature "Magnetic tunnel junction device with perpendicular magnetization films for high-density magnetic random access memory", it is difficult to perform a recording operation on a very small size of cells with a recording current of several milliamperes.

With the MRAM cell according to the sixth embodiment, the ratio of the thickness, t, of the recording layer of the perpendicular MTJ element to the square root of the cell area (the area of the recording layer) S, i.e., t/√S (=aspect ratio), is set large, say, more than two. Incidentally, the recording layer is 100 nm in thickness and 0.05×0.05 μm in area.

Setting the aspect ratio large results in lowered demagnetizing factor, allowing perpendicular magnetization to be realized with relatively small anisotropic energy. In other words, a high aspect ratio allows a perpendicular magnetization film small in coercive force to be realized.

Figure 19:
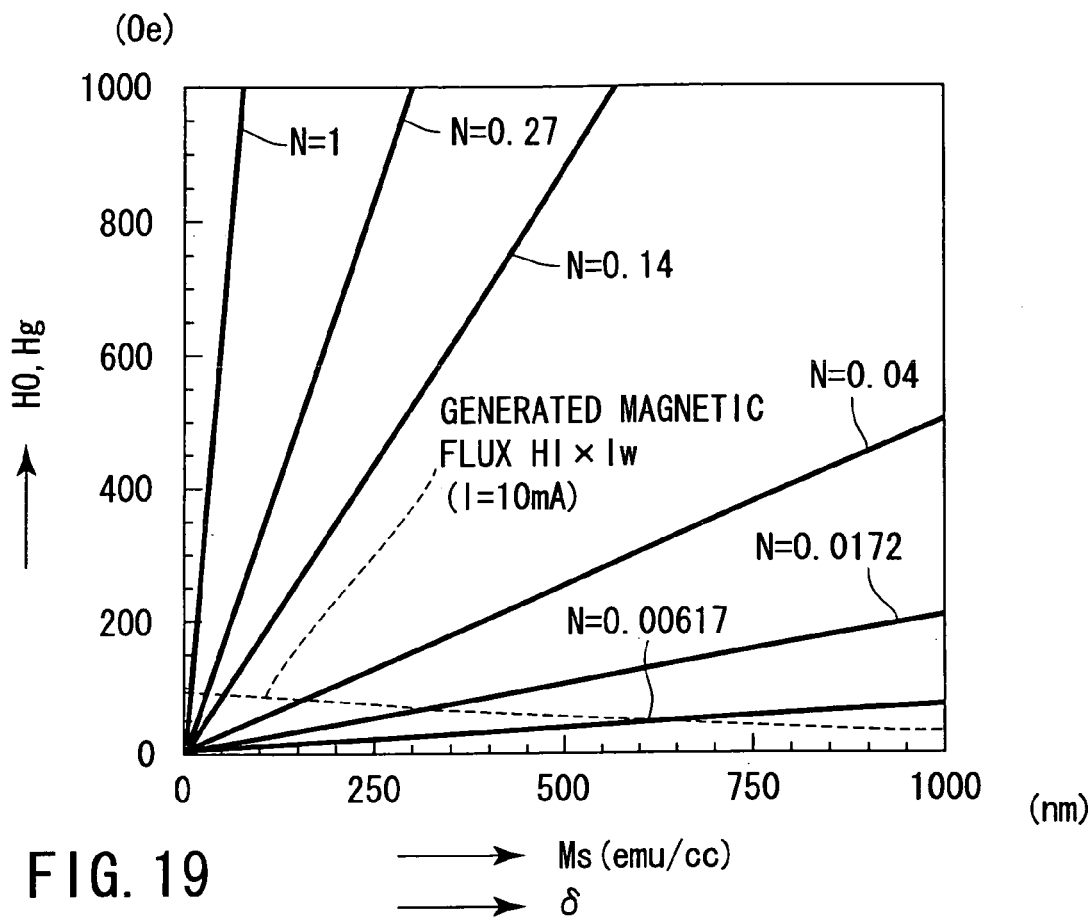
FIG. 19 is a characteristic diagram illustrating criteria for defining the aspect ratio in an MRAM cell according to a sixth embodiment of the present invention.

FIG. 19 shows criteria for defining the aspect ratio in the sixth embodiment. In this figure, the axis of abscissa indicates the saturation magnetization, Ms emu/cc, of the recording layer of the MTJ element 10 and the distance, δ nm, between the write wiring and the MTJ element, while the axis of ordinate indicates the magnetic field strength, Ho, based on write current (recording current) in the write wiring and the anisotropic magnetic field, Hg, for keeping the direction of magnetization perpendicular to the film surface.

From FIG. 19, it can be seen that a writable perpendicular magnetization film can be realized provided that the following relationship is satisfied:

$$HI \times Iw > 4\pi NM$$

where HI is the magnetic field per milliampere of write current, Iw is the recording current, N is the demagnetizing factor, and M is the saturation magnetization M of the recording layer. Here, the magnetic field that can be generated when the write current in the write wiring without magnetic yokes is 1 mA is of the order of 10 Oe at most. The write current should be less than 10 mA and preferably less than 5 mA.

[Seventh Embodiment of MRAM Cell]

Figure 20:
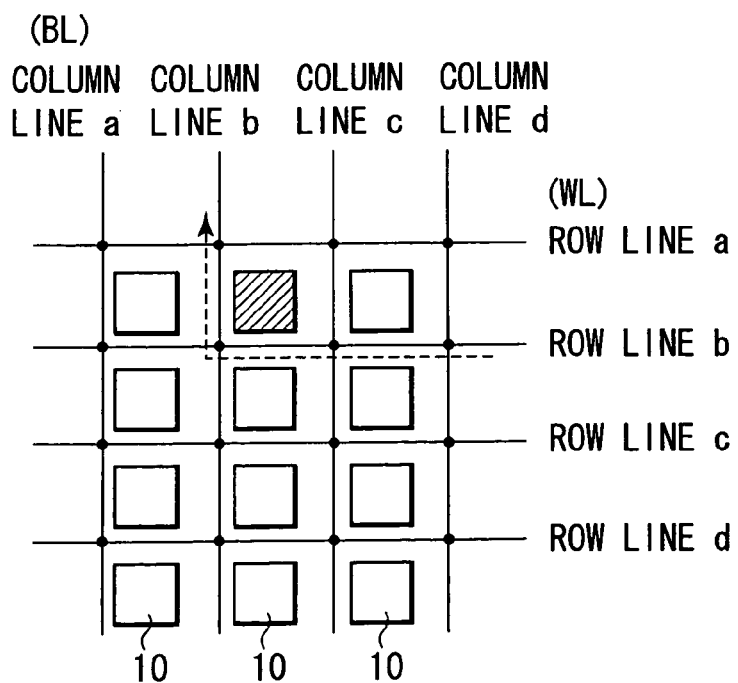
FIG. 20 is a circuit diagram of a memory cell array according to a seventh embodiment of the present invention.

FIG. 20 shows a part of a memory cell array in which MRAM cells of a seventh embodiment are arranged. Perpendicular MTJ elements 10 as described in the first embodiment are arranged in rows and columns on a semiconductor layer, for example, a silicon substrate to make up a cell array. Row lines and column lines arranged in rows and columns do not exist on the same plane. The row lines WL and the column lines BL are arranged on different planes with an insulating film interposed therebetween. Each row line and each column line are electrically connected to each other at the intersection thereof. It is desired that the row line and the column line have some resistance to reduce the current that flows through them. Each of the perpendicular MTJ elements 10 is placed in a respective one of the areas enclosed by the row and column lines.

Selecting a cell and writing into it is performed by selecting a row line and a column line which are adjacent to two orthogonal sides of an MTJ element 10 to be selected and causing currents to flow through the selected row and column lines. In this embodiment, in selecting a cell indicated by oblique lines in FIG. 20, a current is caused to flow from the row line b to the column line b in directions indicated by dotted lines. The other non-selected wirings are supplied with a bias voltage so that no current will flow in them.

When the current flows from the row line b to the column line b, the direction of current flow is changed from the row direction to the column direction in the vicinity of the intersection of the row line b and the column line b. As a result, the selected cell is subjected to the sum of a magnetic field generated by the current in the row direction and a magnetic field generated by the current in the column direction. For this reason, only the selected cell is switched and other cells adjacent to the selected row and column are placed in the half-selected state without the switching of magnetization.

The MTJ elements 10 in FIG. 20 may be sandwiched between yokes as shown in FIG. 6, or may be sandwiched between yokes configured to form a completely closed magnetic path as shown in FIG. 7, or may be configured with no yoke.

The MRAM device according to the first to seventh embodiments can be applied in many ways. Some of such application examples will now be described hereinafter.

APPLICATION EXAMPLE 1

Figure 21:
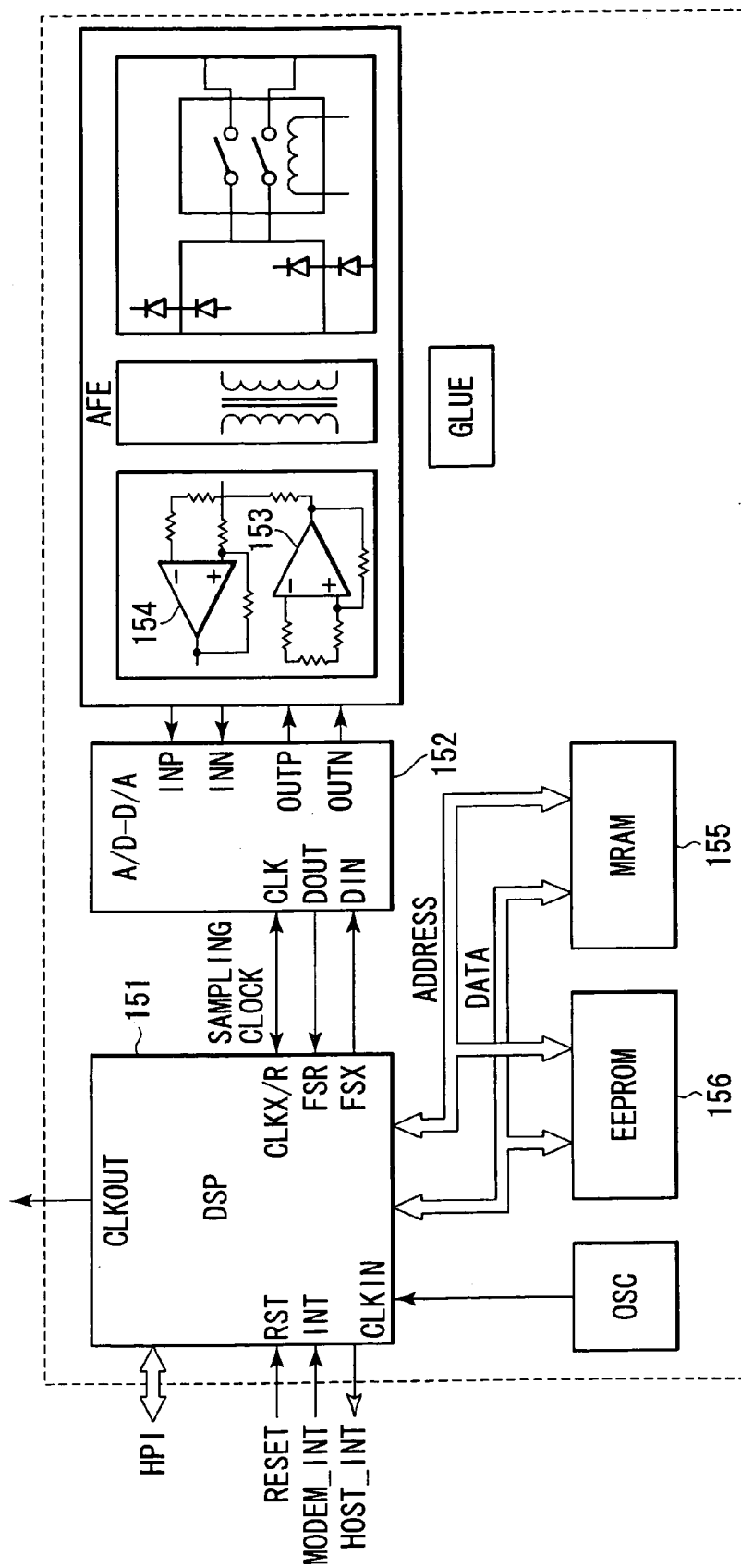
FIG. 21 is a block diagram illustrating the DLS data bus portion of a digital subscriber loop modem as a first application of the MRAM of the present invention.

As one of application examples of the MRAM device, FIG. 21 shows a DSL data path part of a digital subscriber line (DSL) modem. This modem includes a programmable digital signal processor (DSP) 151, an analog to digital converter (ADC) and a digital to analog converter (DAC) 152, a transmission driver 153, and a receiver amplifier 154. In FIG. 21, a band pass filter is eliminated, an MRAM 155 and an EEPROM 156 are shown as various kinds of optional memories which can hold a line code program instead of the band pass filter.

It is to be noted that this application example uses two types of memories, i.e., the MRAM and the EEPROM as memories used to hold a line code program, but the EEPROM may be substituted by the MRAM. That is, only the MRAM may be used without using the two types of memories.

APPLICATION EXAMPLE 2

Figure 22:
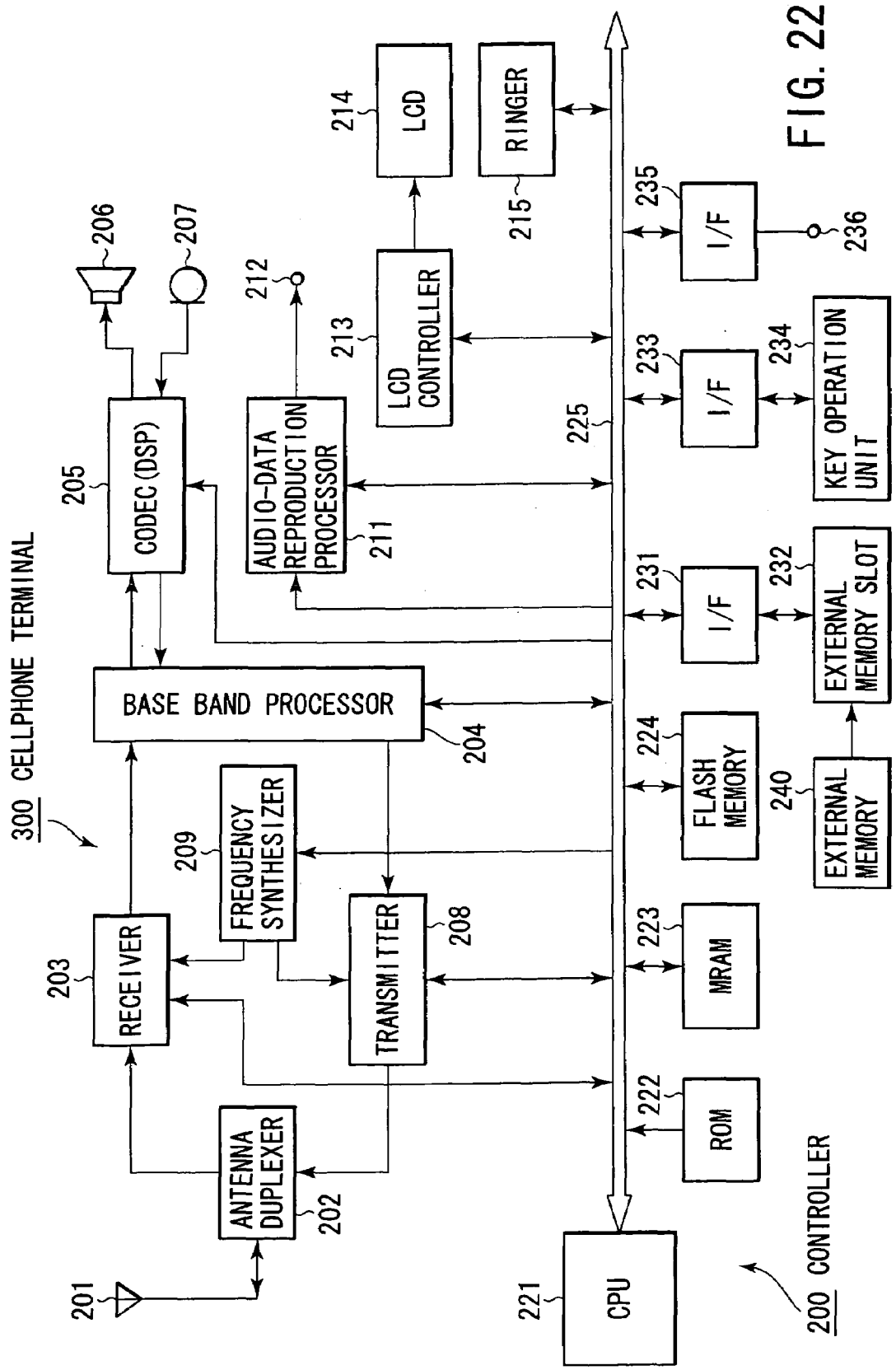
FIG. 22 is a block diagram of a cellphone terminal as a second application of the MRAM of the present invention.

As another application example of the MRAM device, FIG. 22 shows a part in a cellphone terminal 300 which realizes a communication function. As shown in FIG. 22, the part which realizes the communication function includes a transmission/reception antenna 201, an antenna duplexer 202, a receiver 203, a base band processor 204, a Digital Signal. Processor (DSP) 205 uses as an audio codec, a speaker 206, a microphone 207, a transmitter 208, and a frequency synthesizer 209.

Moreover, as shown in FIG. 22, to the cellphone terminal 300 is provided a controller 200 which controls each portion in the cellphone terminal. The controller 200 is a microcomputer in which a CPU 221, a ROM 222, an MRAM 223 and a flash memory 224 are connected through a CPU bus 225.

Here, the ROM 222 previously stores a program executed by the CPU 221 or required data such as fonts for display. Additionally, the MRAM 223 is mainly used as a working area, and it is used when storing data in the middle of calculation according to needs in execution of a program by the CPU 221 or when temporarily storing data transmitted/received with each portion. Further, the flash memory 224 stores immediately preceding setting conditions or the like even if a power supply of the cellphone terminal 300 is turned off, and stores setting parameters in case of adopting a usage that the same settings are employed at the time of turning on the power supply next time. That is, the flash memory 224 is a non-volatile memory in which data stored therein is not eliminated even if the power supply of the cellphone terminal is turned off.

In this application example, although the ROM 222, the MRAM 223 and the flash memory 224 are used, the flash memory 224 may be substituted by the MRAM. Furthermore, the ROM 222 can be also substituted by the MRAM.

It is to be noted that, in FIG. 22, reference numeral 211 denotes an audio data reproduction processor; 212, an external terminal connected to the audio data reproduction processor 211; 213, an LCD controller; 214, an LCD connected to the LCD controller 213; 215, a ringer; 231, an interface provided between the CPU bus 225 and an external memory slot 232, 233, an interface provided between the CPU bus 225 and a key operation unit 234; and 235, an interface between the CPU bus 225 and the external terminal 236. An external memory 240 is inserted into the external memory slot 232.

APPLICATION EXAMPLE 3

FIGS. 23 to 27 show examples that the MRAM device according to the present invention is-applied to a card (MRAM card) that embodies a removable media such as a Smart Media card.

Figure 23:
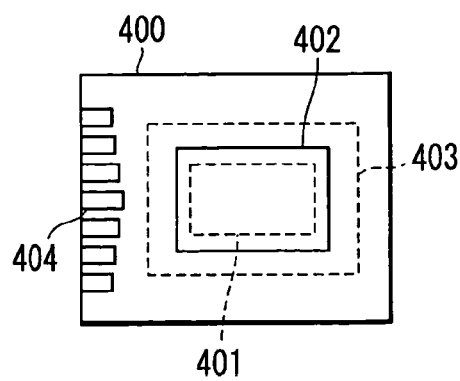
FIG. 23 is a top view of an MRAM card using the MRAM of the present invention.

In a top view of FIG. 23, reference numeral 400 designates an MRAM card main body; 401, an MRAM chip; 402, an opening portion; 403, a shutter; and 404, a plurality of external terminals. An MRAM chip 401 is accommodated in the card main body 400 and exposed to the outside from the opening portion 402. When carrying the MRAM card, the MRAM chip 401 is covered with the shutter 403. The shutter 403 is constituted by a material having an effect to block off an external magnetic field, e.g., ceramics or the like. In case of transferring data, the shutter 403 is opened, and the MRAM chip 401 is exposed. The external terminals 404 are used to fetch content data stored in the MRAM card to the outside.

Figure 24:
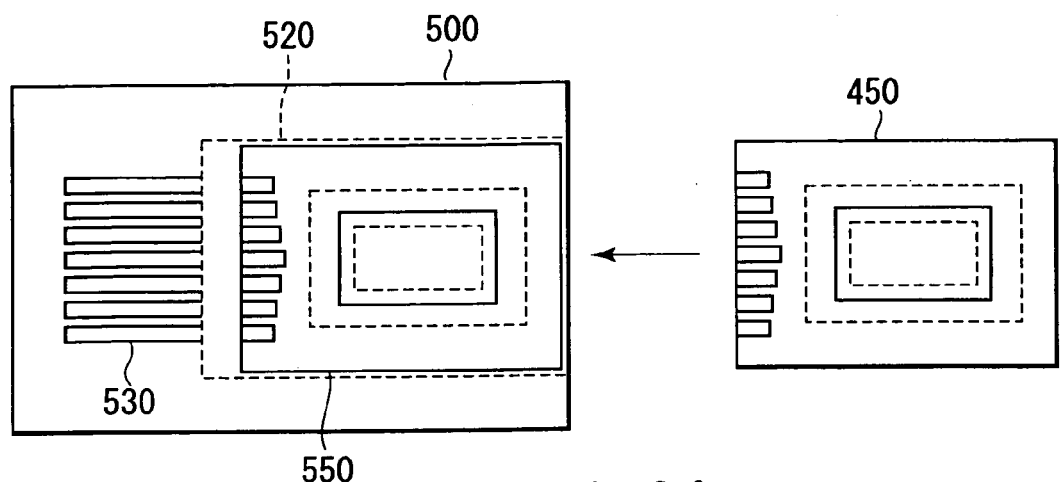
FIG. 24 is a top view of an insertion type of data transfer device as an electronic device using the MRAM card of the present invention.

FIGS. 24 and 25 are a top view and a side view of a card insertion type transfer device used to transfer data to the MRAM card. A second MRAM card 450 used by an end user is inserted from an insertion portion 510 of the transfer device 500 and pushed until the card stops at a stopper 520. The stopper 520 is also used as a member to position a first MRAM card 550 and the second MRAM card 450. With the second MRAM card 450 being arranged at a predetermined position, data stored in the first MRAM card 550 is transferred to the second MRAM card 450.

Figure 26:
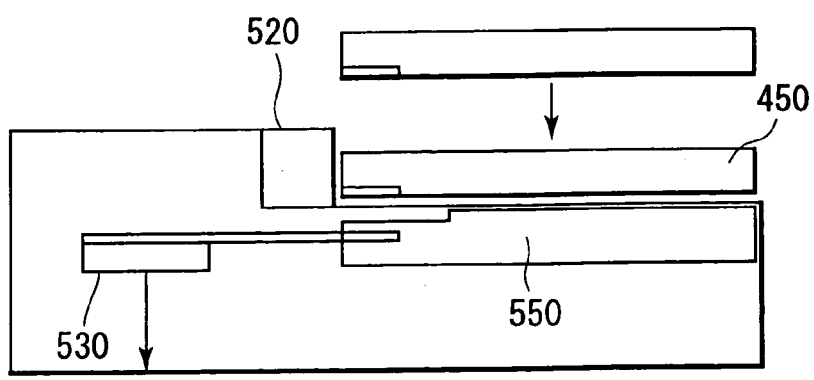
FIG. 26 is a sectional view of a fitting type of data transfer device as another example of an electronic device of the present invention.

FIG. 26 is a side view of a fitting type transfer device. As indicated by an arrow in the drawing, this device is of a type which mounts the second MRAM card 450 on the first MRAM card 550 so as to be fitted in with the stopper 520 being used as a target. The transfer method is the same as that of the card insertion type, thereby eliminating its explanation.

FIG. 27 is a side view of a slide type transfer device. Like a CD-ROM drive, a DVD drive and others, a sliding tray 560 is provided in the transfer device 500, and the sliding tray 560 slides as indicated by an arrow in the horizontal direction in the drawing. When the sliding tray 560 has moved to a state indicated by a broken line in the drawing, the second MRAM card 450 is mounted on the sliding tray 560. Thereafter, the sliding tray 560 carries the second MRAM card 450 into the transfer device 500. Since the point that the second MRAM card 450 is carried in such a manner that an end portion of this card is brought into contact with the stopper 520 and the transfer method are the same as those of the card insertion type, their explanation is eliminated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory device comprising:
a perpendicular magnetoresistive element having first and second magnetic layers and a nonmagnetic layer sandwiched between the first and second magnetic layers, the first magnetic layer forming a recording layer and the second magnetic layer forming a fixed layer, and each of the first and second magnetic layers being magnetized in a direction perpendicular to its plane; and a write wiring configured to place along a direction perpendicular to the direction of the thickness of the magnetoresistive element, the write wiring writing data into the magnetoresistive element by generating a magnetic field when supplied with a current and applying the generated magnetic field to the magnetoresistive element in the direction in which the magnetic layers are magnetized, the direction of magnetization of the recording layer being changed,
said magnetic random access memory device further comprising a magnetic yoke member which holds the magnetoresistive element in the direction of the thickness and applies a magnetic field generated by the write wiring to the two magnetic layers of the magnetoresistive element.

2. The device according to claim 1, wherein the magnetic yoke member is a portion of a surrounding yoke which has a surrounding closed magnetic path that surrounds the write wiring.

3. The device according to claim 2, wherein a first electrically insulating film is provided in a portion of the surrounding closed magnetic path of the surrounding yoke, a second electrically insulating film is provided between the surrounding yoke and the write wiring, and the magnetic yoke forms a part of a current path which allows a current to flow in the magneto-resistive element at the time of reading stored data from the magnetoresistive element.

4. The device according to claim 1, wherein the fixed layer includes a high Hc magnetic material that is high in coercive force, and the recording layer includes a low Hc magnetic material that is lower in coercive force than the fixed layer.

5. The device according to claim 4, wherein the fixed layer and the recording layer are each made of an alloy that contains at least one of Fe, Co, and Ni or an alloy that contains at least one of Fe, Co, and Ni and at least one of Cr, Pt, and Pd.

6. The device according to claim 4, wherein the fixed layer and the recording layer are each made of alternate layers of at least one element of Fe, Co, and Ni or an alloy that contains the one element and one element of Cr, Pt, and Pd or an alloy that contains the one element.

7. The device according to claim 1, wherein each of the first and second magnetic layers is made of a ferromagnetic material.

8. The device according to claim 1, wherein each of the first and second magnetic layers is a synthetic antiferromagnetic structure.

9. The device according to claim 1, further comprising a pair of third magnetic layers provided between the nonmagnetic layer and one of the first and second magnetic layers and between the nonmagnetic layer and the other of the first and second magnetic layers, each of the pair of third magnetic layers being made of at least one element of Fe, Co, and Ni or an alloy that contains the one element.

10. The device according to claim 1, wherein the magnetic yoke member includes soft magnetic bodies and soft magnetic tips each of which is adjacent to a corresponding one of the first and second magnetic layers.

11. The device according to claim 10, wherein the soft magnetic tips are made of a material which is higher in saturation magnetic flux density than the soft magnetic bodies.

12. The device according to claim 11, wherein each of the soft magnetic tips is in contact with a corresponding one of the first and second magnetic layers in a self-aligned state.

13. The device according to claim 1, further comprising a cell selecting transistor connected to the write wiring, the cell selecting transistor selects the magnetoresistive element.

14. A magnetic random access memory device comprising: a perpendicular magnetoresistive element having a first and second magnetic layers and a nonmagnetic layer sandwiched between the first and second magnetic layers, the first magnetic layer forms a recording layer and the second magnetic layer forms a fixed layer, and each of the first and second magnetic layers being magnetized in a direction perpendicular to its plane; a first and second write wirings configured to place along a direction perpendicular to the direction of the thickness of the magnetoresistive element with the magnetoresistive element interposed therebetween, the first and second write wirings write data into the magnetoresistive element by generating magnetic fields when supplied with write currents and applying the generated magnetic fields to the magnetoresistive element in the direction in which the first and second magnetic layers are magnetized, the direction of magnetization of the recording layer is changed; and a magnetic yoke member having completely closed magnetic paths each of which surrounds a corresponding one of the first and second write wirings, magnetic yoke member holds the magnetoresistive element in the direction of its thickness in a position between the first and second write wirings, the magnetic fields generated by the first and second write wirings being applied to the first and second magnetic layers of the magnetoresistive element.

15. The device according to claim 14, wherein the magnetoresistive element being subjected to the magnetic field generated when the write current flows in one of the first and second write wirings or magnetic fields generated when write currents flow in the first and second write wirings in opposite directions.

16. A magnetic random access memory device comprising: a write wiring configured to supply with a write current to generate a magnetic field; first and second perpendicular magnetoresistive elements configured to place on opposite sides of the write wiring and each having a first and second magnetic layers and a nonmagnetic layer sandwiched between the first and second magnetic layers, each of the first and second magnetic layers being magnetized in a direction perpendicular to its plane; and a magnetic yoke member having a completely closed magnetic path that surrounds the write wiring, the magnetic yoke member holds the first and second magnetoresistive elements in the direction of their thickness on opposite sides of the write wiring, and applies the magnetic field generated by the write wiring to the first and second magnetic layers of each of the first and second magnetoresistive elements to write data into the first and second perpendicular magnetoresistive elements.

17. A magnetic random access memory device comprising: a cell array having a plurality of perpendicular magnetoresistive elements which are arranged in rows and columns on a semiconductor layer, each of the perpendicular magnetoresistive elements having a first and second magnetic layers and a nonmagnetic layer sandwiched between the first and second magnetic layers, each of the first and second magnetic layers being magnetized in a direction perpendicular to its plane; a plurality of first write wirings configured to arrange in the row direction, each of the first write wirings being placed in close proximity to the magnetoresistive elements arranged in the same row of the cell array in a direction perpendicular to the direction of the thickness of the magnetoresistive elements, each of said plurality of first write wirings being generated a magnetic field when supplied with a write current; a plurality of second write wirings configured to arrange in the column direction, each of the second write wirings being placed in close proximity to the magnetoresistive elements arranged in the same column of the cell array in a direction perpendicular to the direction of the thickness of the magnetoresistive elements, each of said plurality of second write wirings being generated a magnetic field when supplied with a write current; a plurality of first magnetic yokes each having a completely closed magnetic path that surrounds one of the first write wirings, a magnetic field generated by the corresponding first write wiring being applied to the first and second magnetic layers of the corresponding magnetoresistive elements; and a plurality of second magnetic yokes each having a completely closed magnetic path that surrounds one of the second write wirings, a magnetic field generated by the corresponding second write wiring being applied to the first and second magnetic layers of the corresponding magnetoresistive elements, the second magnetic yokes being placed at right angles with the first magnetic yokes, wherein one of the first and second magnetic yokes holds a corresponding magnetoresistive element in the direction of its thickness and the other holds the magnetoresistive element in the direction of its direction through a portion of the one of the first and second magnetic yokes.

18. The device according to claim 17, wherein each of the magnetoresistive elements being subjected to only a magnetic field generated by the corresponding first write wiring through the first magnetic yoke, or only a magnetic field generated by the corresponding second write wiring through the second magnetic yoke, or magnetic fields generated by the corresponding first and second write wirings through the first and second magnetic yokes.

19. A magnetic random access memory device comprising: a cell array having a plurality of perpendicular magnetoresistive elements which are arranged in rows and columns on a semiconductor layer, each of the perpendicular magnetoresistive elements having a first and second magnetic layers and a nonmagnetic layer sandwiched between the first and second magnetic layers, each of the first and second magnetic layers being magnetized in a direction perpendicular to its plane; a plurality of first write wirings configured to arrange in the row direction, each of the first write wirings being placed in close proximity to the magnetoresistive elements arranged in the same row of the cell array in a direction perpendicular to the direction of the thickness of the magnetoresistive elements; and a plurality of second write wirings configured to arrange in the column direction, each of the second write wirings being placed in close proximity to the magnetoresistive elements arranged in the same column of the cell array in a direction perpendicular to the direction of the thickness of the magnetoresistive elements.

20. A magnetic random access memory device comprising: a perpendicular magnetoresistive element having a first and second magnetic layers and a nonmagnetic layer sandwiched between the first and second magnetic layers, the first magnetic layer forms a recording layer and the second magnetic layer forms a fixed layer, and each of the first and second magnetic layers being magnetized in a direction perpendicular to its plane; and a write wiring configured to place along a direction perpendicular to the direction of the thickness of the magnetoresistive element, the write wiring writes data into the magnetoresistive element by generating a magnetic field when supplied with a write current and the generated magnetic field being applied to the magnetoresistive element in the direction in which the magnetic layers, the direction of magnetization of the recording layer being changed, wherein saturation magnetization M of the recording layer satisfies a relationship of $Iw \times HI > 4\pi NM$ where Iw is the recording current in the write wiring, HI is the magnetic field generated per one milliampere of the recording current, and N is the demagnetizing factor.

21. An electronic card comprising: a semiconductor chip including a perpendicular magnetoresistive element having a first and second magnetic layers and a nonmagnetic layer sandwiched between the first and second magnetic layers, the first magnetic layers forms a recording layer and the second magnetic layer forms a fixed layer, and each of the first and second magnetic layers being magnetized in a direction perpendicular to its plane, and a write wiring, placed along a direction perpendicular to the direction of the thickness of the magnetoresistive element, which writes data into the magnetoresistive element by generating a magnetic field when supplied with a write current and applying the generated magnetic field to the magnetoresistive element in the direction in which the first and second magnetic layers are magnetized, the direction of magnetization of the recording layer being changed; a card body which houses the semiconductor chip and has a window on one side of the semiconductor chip; a shutter which opens and shuts the window of the card body and has the magnetic shielding effect; and a plurality of external terminals provided along at least one edge of the card body to electrically connect the semiconductor chip to a device external to the card body.

22. An electronic device comprising: an electronic card including a semiconductor chip, a card body, a shutter, and a plurality of external terminals, the semiconductor chip including a perpendicular magnetoresistive element having a first and second magnetic layers and a nonmagnetic layer sandwiched between the first and second magnetic layers, the first magnetic layer forms a recording layer and the second magnetic layer forms a fixed layer, and each of the first and second magnetic layers being magnetized in a direction perpendicular to its plane, and a write wiring, placed along a direction perpendicular to the direction of the thickness of the magnetoresistive element, the write wiring writes data into the magnetoresistive element by generating a magnetic field when supplied with a write current and applying the generated magnetic field to the magnetoresistive element in the direction in which the first and second magnetic layers are magnetized, the direction of magnetization of the recording layer being changed, the card body being adapted to house the semiconductor chip and having a window on one side of the semiconductor chip, the shutter being adapted to open and shut the window of the card body and having the magnetic shielding effect, and the external terminals being provided along at least one edge of the card body to electrically connect the semiconductor chip to a device external to the card body; a card slot into which the electronic card is loaded; a card interface electrically connected to the card slot; and a storage device which sends or receives data to or from the electronic card.

23. A magnetic random access memory device comprising: a perpendicular magnetoresistive element having first and second magnetic layers and a nonmagnetic layer sandwiched between the first and second magnetic layers, the first magnetic layer forming a recording layer, the second magnetic layer forming a fixed layer, each of the first and second magnetic layers being magnetized in a direction perpendicular to its plane, and a write wiring configured to place along a direction perpendicular to the direction of the thickness of the magnetoresistive element, the write wiring writing data into the magnetoresistive element by generating a magnetic field when supplied with a current and applying the generated magnetic field to the magnetoresistive element in the direction in which the magnetic layers are magnetized, the direction of magnetization of the recording layer being changed, each of the first and second magnetic layers being made of a ferromagnetic material or a synthetic antiferromagnetic structure, wherein the fixed layer and the recording layer are each made of an alloy that contains at least one of Fe, Co, and Ni or an alloy that contains at least one of Fe, Co, and Ni and at least one of Cr, Pt, and Pd or the fixed layer and the recording layer are each made of alternate layers of at least of one element of Fe, Co, and Ni or an alloy that contains the one element and one element of Cr, Pt, and Pd or an alloy that contains the one element.

24. The device according to claim 23, further comprising: a cell selecting transistor connected to the write wiring, the cell selecting transistor being configured to select the magnetoresistive element.

* * * * *